US012765062B2

(12) United States Patent
Liu et al.

(10) Patent No.: US 12,765,062 B2
(45) Date of Patent: Oct. 13, 2026

(54) DISPLAY PANEL WITH DUAL INORGANIC INSULATING LAYERS AND DISPLAY APPARATUS INCLUDING THE SAME

(71) Applicant: Xiamen Tianma Micro-Electronics Co., Ltd., Xiamen (CN)

(72) Inventors: Bingping Liu, Xiamen (CN); Xuexin Lan, Xiamen (CN); Xianyan Yang, Xiamen (CN); Shaowei Su, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 543 days.

(21) Appl. No.: 18/362,455

(22) Filed: Jul. 31, 2023

(65) Prior Publication Data

US 2023/0378194 A1 Nov. 23, 2023

(30) Foreign Application Priority Data

Apr. 19, 2023 (CN) ......................... 202310423575.3

(51) Int. Cl.

*H10D 86/60* (2025.01)
*G06F 3/041* (2006.01)
*H10D 86/40* (2025.01)

(52) U.S. Cl.

CPC ........... *H10D 86/60* (2025.01); *G06F 3/0412* (2013.01); *G06F 3/04164* (2019.05); *H10D 86/441* (2025.01)

(58) Field of Classification Search

CPC .. H10D 86/60; H10D 86/441; H10D 30/6735; H10D 30/6757; G06F 3/0412;

(Continued)

(56) References Cited

U.S. PATENT DOCUMENTS 9,385,345 B2 * 7/2016 Lee ........................ H10K 71/30
10,256,438 B2 * 4/2019 Kim .................... H10K 50/125

(Continued)

FOREIGN PATENT DOCUMENTS

CN 103280428 B 5/2016
CN 113948532 A 1/2022

OTHER PUBLICATIONS

Office Action mailed Aug. 3, 2024, issued in corresponding Chinese Application No. 202310423575.3, filed Apr. 19, 2023, 9 pages.

*Primary Examiner* — Caleb E Henry

(74) *Attorney, Agent, or Firm* — CHRISTENSEN O'CONNOR JOHNSON KINDNESS PLLC

(57) ABSTRACT

A display panel and a display apparatus are provided. A first base plate includes a first substrate, a transistor array layer, a pixel electrode layer, a common electrode layer, a first inorganic insulating layer, and a second inorganic insulating layer. The transistor array layer is provided on a side of the first substrate. The pixel electrode layer and the common electrode layer are arranged on a side of the transistor array layer away from the first substrate. The transistor array layer includes a transistor, the pixel electrode layer includes a pixel electrode, and the common electrode layer includes common electrodes. An insulating layer between the transistor array layer and one of the pixel electrode layer and the common electrode layer close to the transistor array layer is the first inorganic insulating layer. The second inorganic insulating layer is provided between the pixel electrode layer and the common electrode layer.

19 Claims, 29 Drawing Sheets

(58) Field of Classification Search

CPC ....... G06F 3/04164; G06F 2203/04103; G06F 3/0443; G02F 1/136227; G02F 1/13338; G02F 1/134309; G02F 2201/121; H10H 20/857; H10H 20/01; H10H 20/831; H10H 29/142; H10H 20/032; H10H 20/0364; H10H 20/034; H10H 20/0363; H10H 20/018; H10H 20/0361; H10H 20/84; H10H 20/8515; H10H 20/856; H01L 25/0753; H01L 33/62; H01L 27/156; H01L 33/005; H01L 33/38; H01L 2933/0016; H01L 2933/0066; H01L 33/0093; H01L 33/60; H01L 2933/0058; H01L 33/44; H01L 33/507; H01L 2933/0025; H01L 2933/0041; H01L 51/5056; H01L 27/3244; H01L 51/502; H01L 51/5072; H01L 51/56; H01L 2227/323; H01L 27/322; H01L 2251/303; H05B 33/02; H05B 33/10; H05B 33/12; H05B 33/14

See application file for complete search history.

(56) References Cited

U.S. PATENT DOCUMENTS 10,636,349 B2 * 4/2020 Shin ....................... H04N 25/76
10,867,156 B2 * 12/2020 Li ....................... H10D 86/441
11,487,172 B1 * 11/2022 Gao ................... G02F 1/133567
2008/0258167 A1 * 10/2008 Liu .................... H10H 20/8582 257/E33.056
2009/0316409 A1 * 12/2009 Kim ..................... H05K 1/0295 362/249.14
2013/0320361 A1 * 12/2013 Huang ................ H01L 25/0753 257/88
2015/0084072 A1 * 3/2015 Huang ................... H10H 20/01 438/27
2016/0126256 A1 5/2016 Hwang et al.
2016/0291424 A1 * 10/2016 Sun ................... G02F 1/134309
2016/0291727 A1 * 10/2016 Cao ....................... G06F 3/0445
2016/0357048 A1 * 12/2016 Zhou ................... G02F 1/13439
2017/0263594 A1 * 9/2017 Chung ................. H10H 20/856
2017/0294479 A1 * 10/2017 Cha ....................... H10H 20/01
2017/0345845 A1 * 11/2017 Wu ................... G02F 1/136286
2018/0019428 A1 * 1/2018 Kawamura ............ H10K 59/35
2018/0122870 A1 * 5/2018 Park ....................... H10K 50/11
2018/0375058 A1 * 12/2018 Kawamura ............ H10K 50/82
2019/0006335 A1 * 1/2019 Lee ......................... H01L 23/60
2019/0044023 A1 * 2/2019 Cheng .................... H10H 20/01
2019/0148409 A1 * 5/2019 Bang .................... H10D 86/441 345/173
2019/0165232 A1 * 5/2019 Hung ................... H10H 20/851
2020/0134284 A1 * 4/2020 Ling ...................... H10F 39/198
2022/0069000 A1 * 3/2022 Lo ...................... H10H 20/8312
2022/0231080 A1 * 7/2022 Li ........................ H10H 20/831
2022/0352249 A1 * 11/2022 Park ................... H10H 20/8512

* cited by examiner

DISPLAY PANEL WITH DUAL INORGANIC INSULATING LAYERS AND DISPLAY APPARATUS INCLUDING THE SAME

CROSS-REFERENCE TO RELATED APPLICATIONS

The present application claims priority to Chinese Patent Application No. 202310423575.3, filed on Apr. 19, 2023, the content of which is incorporated herein by reference in its entirety.

TECHNICAL FIELD

The present disclosure relates to the technical field of displays, and in particular to a display panel and a display apparatus.

BACKGROUND

With an active-array flat-panel display (FPD) technology, a display apparatus tends to be lighter, thinner, clearer, and larger in screen-to-body ratio. As an important component in the active-array FPD technology, an array base plate, namely a base plate including transistors arranged in an array, can drive pixels sequentially and accurately.

The array base plate has been widely applied to the fields of liquid crystal display (LCD), organic light-emitting diode (OLED), micro-LED, and mini-LED. Therefore, how to optimize performance and preparation of the existing display panel using the array base plate is an important research topic.

SUMMARY

According to a first aspect, some embodiments of the present disclosure provide a display panel, and the display panel includes a first base plate. The first base plate includes a first substrate, a transistor array layer, a pixel electrode layer, a common electrode layer, a first inorganic insulating layer, and a second inorganic insulating layer. The transistor array layer is provided at a side of the first substrate. Both the pixel electrode layer and the common electrode layer are arranged at a side of the transistor array layer away from the first substrate. The transistor array layer includes a transistor, the pixel electrode layer includes a pixel electrode, and the common electrode layer includes at least one common electrodes. An insulating layer between the transistor array layer and one of the pixel electrode layer and the common electrode layer close to the transistor array layer is the first inorganic insulating layer. The second inorganic insulating layer is provided between the pixel electrode layer and the common electrode layer.

According to a second aspect, an embodiment of the present disclosure provides a display apparatus, and the display apparatus includes a display panel. The display panel includes a first base plate. The first base plate includes a first substrate, a transistor array layer, a pixel electrode layer, a common electrode layer, a first inorganic insulating layer, and a second inorganic insulating layer. The transistor array layer is provided at a side of the first substrate. Both the pixel electrode layer and the common electrode layer are arranged at a side of the transistor array layer away from the first substrate. The transistor array layer includes a transistor, the pixel electrode layer includes a pixel electrode, and the common electrode layer includes common electrodes. An insulating layer between the transistor array layer and one of the pixel electrode layer and the common electrode layer close to the transistor array layer is the first inorganic insulating layer. The second inorganic insulating layer is provided between the pixel electrode layer and the common electrode layer.

BRIEF DESCRIPTION OF DRAWINGS

To describe the technical solutions of the embodiments of the present disclosure more clearly, the following briefly describes the accompanying drawings presented in the embodiments. The accompanying drawings in the following description show merely some examples of the present disclosure, and a person of ordinary skill in the art can still derive other drawings from these accompanying drawings.

DESCRIPTION OF EMBODIMENTS

For a better understanding of the technical solutions of the present disclosure, the following describes in detail the embodiments of the present disclosure with reference to the accompanying drawings.

The described embodiments are merely some but not all of the embodiments of the present disclosure. All other embodiments obtained by a person of ordinary skill in the art base plated on the embodiments of the present disclosure shall fall within the scope of the present disclosure.

Terms in the embodiments of the present disclosure are merely used to describe the embodiments, and are not intended to limit the present disclosure. Unless otherwise specified in the context, words, such as "a", "the", and "this", in a singular form in the embodiments and appended claims of the present disclosure include plural forms.

It should be understood that the term "and/or" in this specification merely describes associations between associated objects, and it indicates three types of relationships. For example, A and/or B may indicate that A alone, A and B, or B alone. The character "/" in this specification generally indicates that the associated objects are in an "or" relationship.

In the description of this specification, it should be understood that the terms such as "substantially", "approximate to", "approximately", "about", "roughly", and "in general" described in the claims and embodiments of the present disclosure mean general agreement within a reasonable process operation range or tolerance range, rather than an exact value.

It should be understood that although the terms such as first, second, and third may be used to describe regions in the embodiments of the present disclosure, these regions should not be limited to these terms. These terms are used only to distinguish the regions from each other. For example, without departing from the scope of the embodiments of the present disclosure, a first region may also be referred to as a second region, and similarly, a second region may also be referred to as a first region.

Figure 1:
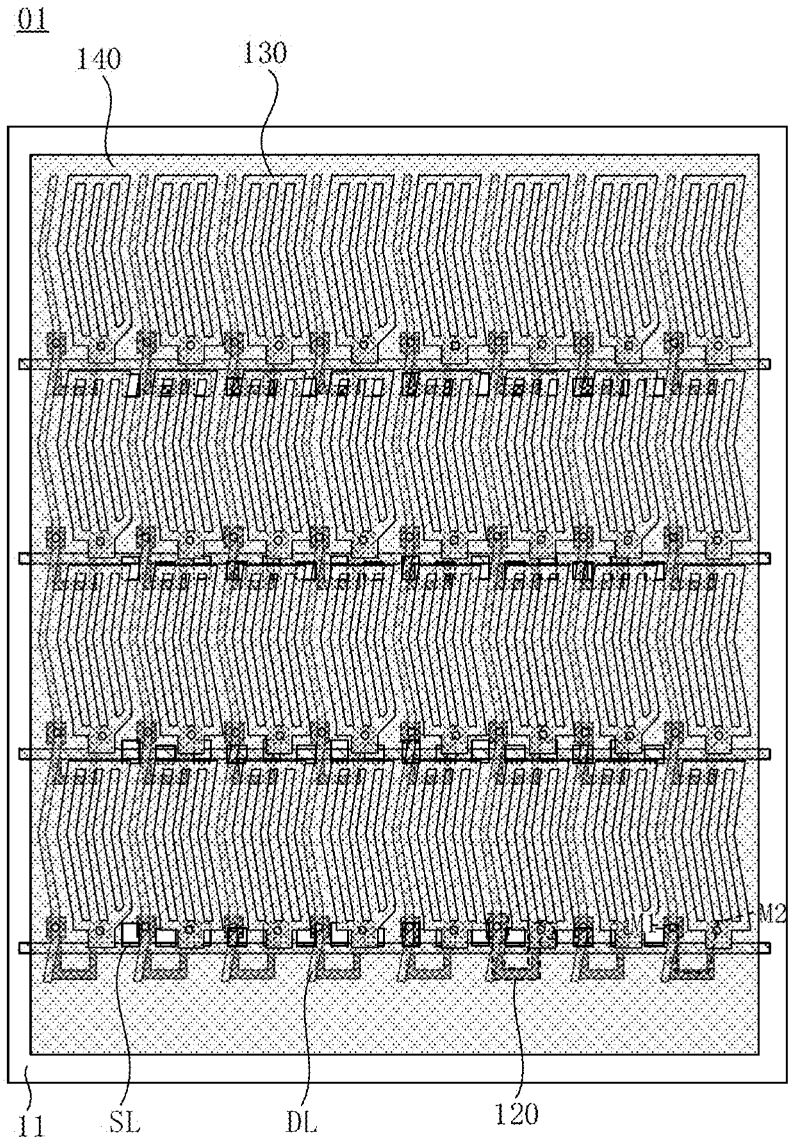
FIG. 1 is a schematic view of a first base plate of a display panel according to some embodiments of the present disclosure.
Figure 2:
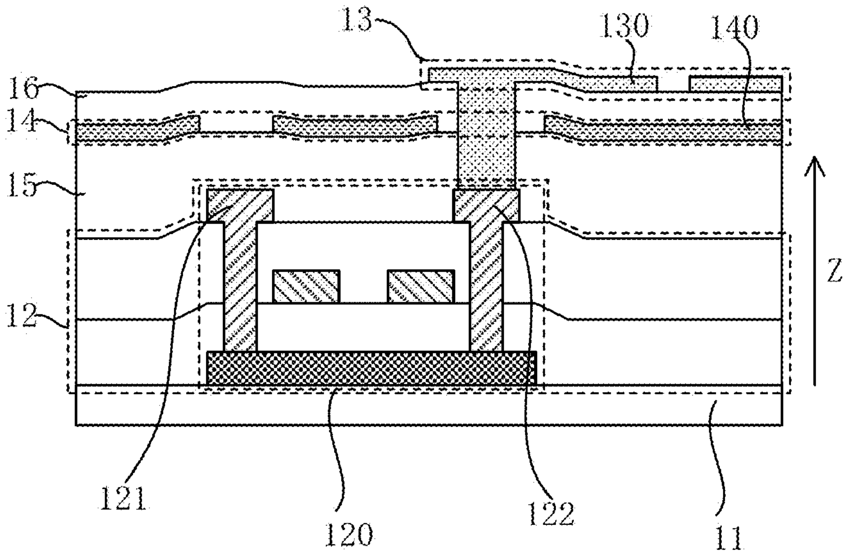
FIG. 2 is a schematic cross-sectional view along line M1-M2 shown in FIG. 1.
Figure 3:
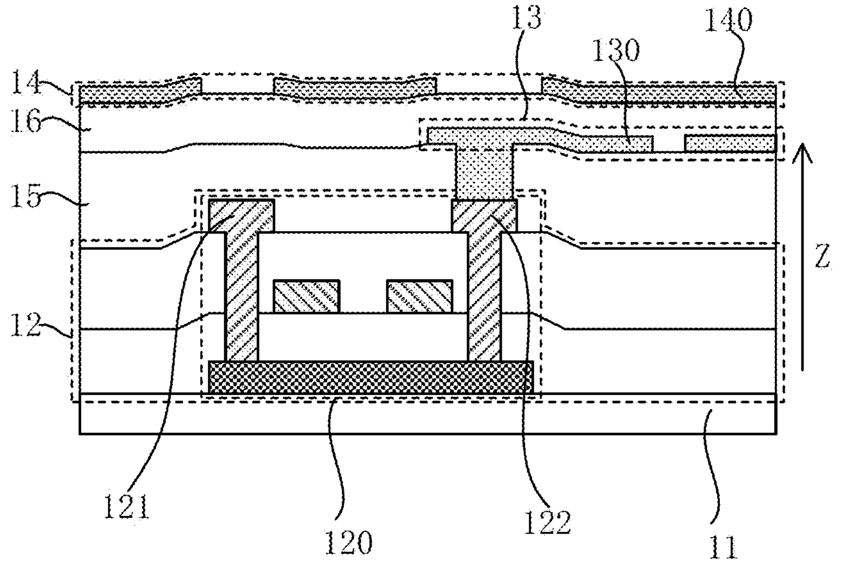
FIG. 3 is another schematic cross-sectional view along line M1-M2 shown in FIG. 1.

FIG. 1 is a schematic view of a first base plate of a display panel according to some embodiments of the present disclosure. FIG. 2 is a schematic cross-sectional view along line M1-M2 shown in FIG. 1. FIG. 3 is another schematic cross-sectional view along line M1-M2 shown in FIG. 1.

As shown in FIG. 1 to FIG. 3, a display panel provided by the embodiment of the present disclosure includes a first base plate 01. The first base plate 01 includes a first substrate 11, a transistor array layer 12, a pixel electrode layer 13, a common electrode layer 14, a first inorganic insulating layer 15, and a second inorganic insulating layer 16.

The transistor array layer 12, the pixel electrode layer 13, and the common electrode layer 14 may be provided at a same side of the first substrate 11. The transistor array layer 12 includes multiple transistors 120, the pixel electrode layer 13 includes multiple pixel electrodes 130, and the common electrode layer 14 includes a common electrode 140.

Both the pixel electrode layer 13 and the common electrode layer 14 are provided at a side of the transistor array layer 12 away from the first substrate 11. The pixel electrode layer 13 and the common electrode layer 14 are prepared upon preparation of the transistor array layer 12. Along a direction Z perpendicular to a plane of the first substrate 11, the common electrodes 140 each cover at least two pixel electrodes 130, namely pixels to which a plurality of the pixel electrodes 130 belong share the common electrode 140.

The transistors 120 each may function as a switch. Referring to FIG. 1 and FIG. 2 as well as FIG. 1 and FIG. 3, at least one transistor of the transistors 120 includes a first electrode 121 and a second electrode 122 respectively electrically connected to a data line DL and a pixel electrode 130. The at least one transistor 120 functions as a switch between the data line DL and the pixel electrode 130.

An insulating layer between one of the pixel electrode layer 13 and the common electrode layer 14 close to the transistor array layer 12 and the transistor array layer 12 is the first inorganic insulating layer 15. That is, the insulating layer between one of the pixel electrode layer 13 and the common electrode layer 14 close to the transistor array layer 12 and the transistor array layer 12 only includes the inorganic insulating layer.

A surface of the first inorganic insulating layer 15 close to the first substrate 11 may come in contact with the transistor array layer 12, and a surface of the first inorganic insulating layer 15 away from the first substrate 11 may come in contact with one of the pixel electrode layer 13 and the common electrode layer 14 close to the transistor array layer 12.

For example, as shown in FIG. 3, the pixel electrode layer 13 is located at a side of the common electrode layer 14 close to the transistor array layer 12. The insulating layer between the pixel electrode layer 13 and the transistor array layer 12 is the first inorganic insulating layer 15. In some embodiments, the surface of the first inorganic insulating layer 15 close to the first substrate 11 may be in contact with the transistor array layer 12, and the surface of the first inorganic insulating layer 15 away from the first substrate 11 may be in contact with the pixel electrode layer 13.

For example, as shown in FIG. 2, the common electrode layer 14 is located at a side of the pixel electrode layer 13 close to the transistor array layer 12. The insulating layer between the common electrode layer 14 and the transistor array layer 12 is the first inorganic insulating layer 15. In some embodiments, the surface of the first inorganic insulating layer 15 close to the first substrate 11 may be in contact with the transistor array layer 12, and the surface of the first inorganic insulating layer 15 away from the first substrate 11 may be in contact with the common electrode layer 14.

In the embodiment of the present disclosure, the second inorganic insulating layer 16 is provided between the pixel electrode layer 13 and the common electrode layer 14. In some embodiments, an insulating layer between the pixel electrode layer 13 and the common electrode layer 14 is the second inorganic insulating layer 16. That is, the insulating layer between the pixel electrode layer 13 and the common electrode layer 14 only includes the inorganic insulating layer.

One of a surface of the second inorganic insulating layer 16 close to the first substrate 11 and a surface of the second inorganic insulating layer 16 away from the first substrate 11 may be in contact with the pixel electrode layer 13, and the other one of the surface of the second inorganic insulating layer 16 close to the first substrate 11 and the surface of the second inorganic insulating layer 16 away from the first substrate 11 may be in contact with the common electrode layer 14.

In the embodiments of the present disclosure, the insulating layer between one of the pixel electrode layer 13 and the common electrode layer 14 close to the transistor array layer 12 and the transistor array layer 12 serves as the inorganic insulating layer. The inorganic insulating layer is thinner than the organic insulating layer. Therefore, the display panel provided by the embodiments of the present disclosure can be thinner. The inorganic insulating layer is usually prepared by chemical deposition. The inorganic insulating layer has a lower cost and a simpler preparation process than the organic insulating layer, thereby reducing a preparation cost of the display panel. Meanwhile, the method for preparing the inorganic insulating layer does not produce a harmful substance to a device in the first base plate, thus improving a preparation yield of the display panel.

The insulating layer between the pixel electrode layer 13 and the common electrode layer 14 also includes the inorganic insulating layer. When preparing vias penetrating the first inorganic insulating layer 15 and the second inorganic insulating layer 16, the first inorganic insulating layer 15 and the second inorganic insulating layer 16 can be etched at the same time in a same etching process to form the vias in the first inorganic insulating layer 15 and the vias in the second inorganic insulating layer 16. Meanwhile, when the second inorganic insulating layer 16 includes vias not communicating with the via located in the first inorganic insulating layer 15, and the via can also be formed in the above etching process, which greatly reduces the etching process.

In some embodiments of the present disclosure, the first inorganic insulating layer 15 includes at least one of silicon oxide or silicon nitride. That is, the first inorganic insulating layer 15 may be a silicon oxide layer, a silicon nitride layer or a composite layer by stacking silicon oxide and silicon nitride. In some embodiments, the first inorganic insulating layer 15 may also be a layer including a mixture of the silicon oxide and the silicon nitride.

In some embodiments of the present disclosure, the second inorganic insulating layer 16 includes at least one of silicon oxide and silicon nitride. The second inorganic insulating layer 16 may be a silicon oxide layer, a silicon nitride layer, or a composite layer by stacking silicon oxide and silicon nitride. In some embodiments, the second inorganic insulating layer 16 may also be a layer including a mixture of the silicon oxide and the silicon nitride.

In an embodiment of the present disclosure, both the first inorganic insulating layer 15 and the second inorganic insulating layer 16 include silicon oxide, or silicon nitride. For example, the first inorganic insulating layer 15 is a composite layer by stacking silicon oxide and silicon nitride. The second inorganic insulating layer 16 is a silicon oxide layer or a silicon nitride layer.

Since the preparation process and patterning process of the silicon oxide and silicon nitride are very mature, when the first inorganic insulating layer 15 and the second inorganic insulating layer 16 include the silicon oxide and/or silicon nitride, the preparation difficulty of the display panel can be reduced. In addition, the silicon oxide and silicon nitride have a desirable compactness, can protect the device from water and oxygen, and can prevent mutual interference of conductive particles between the transistor array layer, the pixel electrode layer and the common electrode layer.

In an embodiment of the present disclosure, the first inorganic insulating layer 15 has a thickness of less than or equal to 6,000 angstroms. For example, the first inorganic insulating layer 15 may have a thickness of about 3,000 angstroms, about 2,000 angstroms, or about 1,000 angstroms.

In an embodiment of the present disclosure, the second inorganic insulating layer 16 has a thickness of less than or equal to 6,000 angstroms. For example, the second inorganic insulating layer 16 may have a thickness of about 3,000 angstroms, about 2,000 angstroms, or about 1,000 angstroms.

The first inorganic insulating layer 15 and the second inorganic insulating layer 16 each have the thickness of less than 6,000 angstroms, which can effectively shorten a preparation cycle of the display panel. Meanwhile, at least one of the vias of the first inorganic insulating layer 15 communicates with at least one of the vias of the second inorganic insulating layer 16. When these communicating vias are prepared in the etching process, the process difficulty is low and the process yield is high.

In an embodiment of the present disclosure, as shown in FIG. 2 and FIG. 3, the first inorganic insulating layer 15 may have a greater thickness than the second inorganic insulating layer 16. For example, the first inorganic insulating layer 15 has a thickness of about 3,000 angstroms, and the second inorganic insulating layer 16 has a thickness of about 1,000 angstroms.

The first inorganic insulating layer 15 is provided on the transistor array layer 12. With the larger thickness of the first inorganic insulating layer 15, the surface of the first inorganic insulating layer 15 away from the transistor array layer 12 is relatively flat, which can provide the flat bearing surface for the structure thereon.

With the smaller thickness of the second inorganic insulating layer 16, the display panel is lighter and thinner, and the preparation cycle of the first base plate is shortened. Since both the pixel electrode layer 13 and the common electrode layer 14 are relatively thin, the surface of the second inorganic insulating layer 16 away from the first inorganic insulating layer 15 is relatively flat, no matter whether the second inorganic insulating layer 16 is prepared upon preparation of the pixel electrode layer 13 or upon preparation of the common electrode layer 14, and there is no adverse risk to the process.

In an embodiment of the present disclosure, the transistor 120 includes a polysilicon semiconductor layer. In an embodiment of the present disclosure, the transistor in the transistor array layer 12 may be a low-temperature polysilicon transistor.

Figure 4:
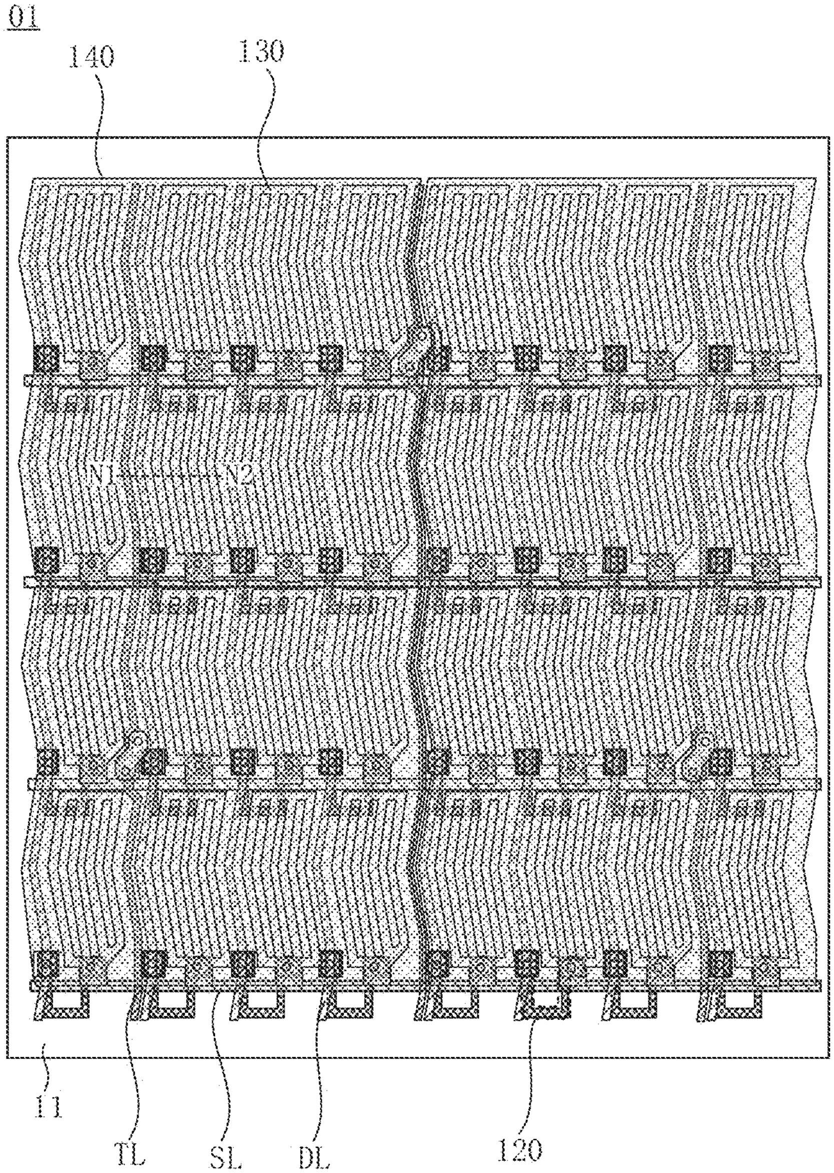
FIG. 4 is another schematic view of a first base plate of a display panel according to some embodiments of the present disclosure.
Figure 5:
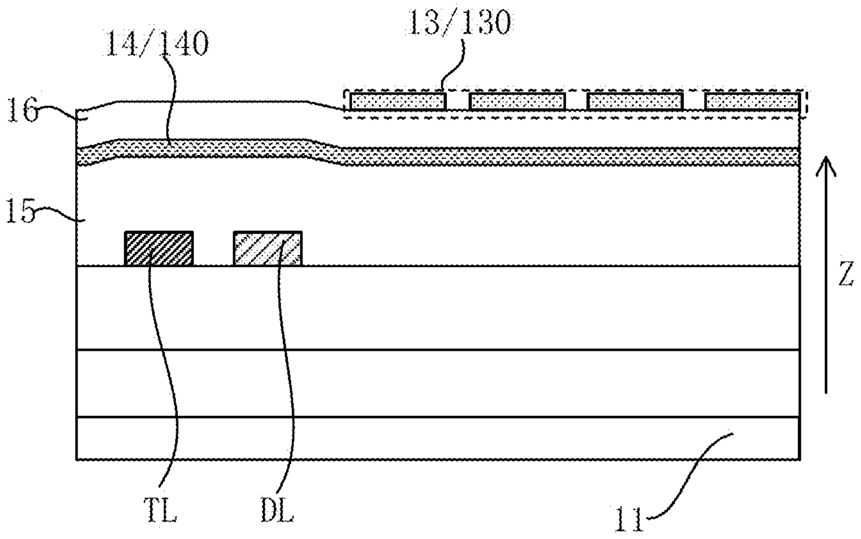
FIG. 5 is a schematic cross-sectional view along line N1-N2 shown in FIG. 4.

FIG. 4 is another schematic view of a first base plate of a display panel according to some embodiments of the present disclosure. FIG. 5 is a schematic cross-sectional view along line N1-N2 shown in FIG. 4.

In the drawings of the following embodiment, the common electrode layer 14 is located between the pixel electrode layer 13 and the first substrate 11, for the sake of clarity. Unless otherwise specified, the principle in the following embodiment is also applied to the display panel, in which the pixel electrode layer 13 is located between the common electrode layer 14 and the first substrate 11.

Referring to FIG. 4 and FIG. 5, the common electrode layer 14 includes multiple common electrodes 140. The common electrode 140 may be reused as a touch electrode. The common electrodes 140 may be reused as a touch electrode for mutual-capacitive touch detection, and may also be reused as a touch electrode for self-capacitive touch detection.

In an embodiment of the present disclosure, as shown in FIG. 4 and FIG. 5, the first base plate 01 includes a touch line TL. The touch line TL provides a signal to the common electrodes 140. The touch line TL may be electrically connected to the common electrode 140 and provide the common electrode 140 with a signal associated with touch detection.

In the embodiment of the present disclosure, the touch line TL is provided at a side of the common electrode layer 14 close to the first substrate 11. For example, the touch line TL may be provided at a side of the first inorganic insulating layer 15 close to the first substrate 11.

Figure 6:
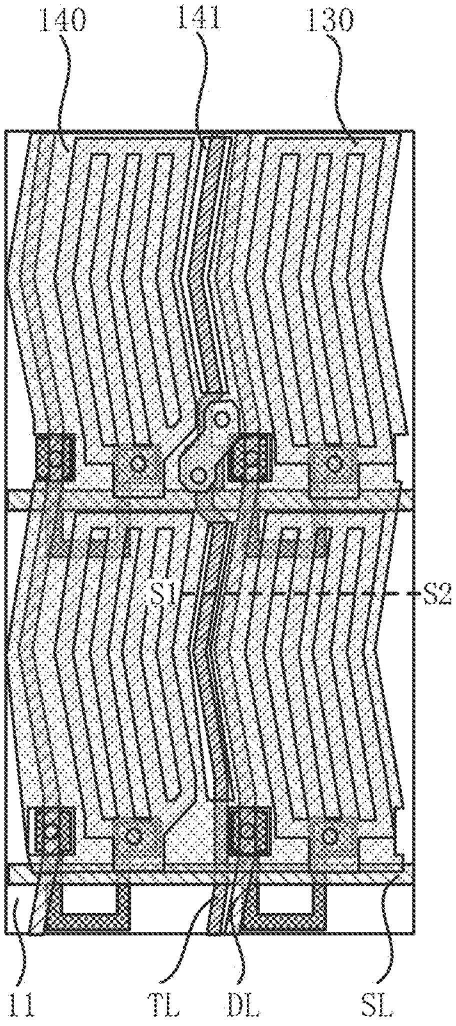
FIG. 6 is a schematic partial view of a first base plate of a display panel according to some embodiments of the present disclosure.
Figure 7:
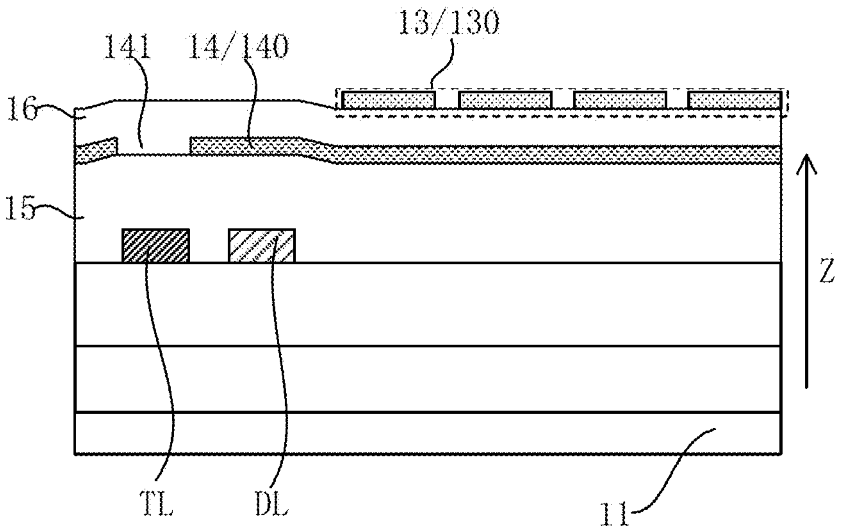
FIG. 7 is a schematic cross-sectional view along line S1-S2 shown in FIG. 6.

FIG. 6 is a schematic partial view of a first base plate of a display panel according to some embodiments of the present disclosure. FIG. 7 is a schematic cross-sectional view along line S1-S2 shown in FIG. 6.

In a technical solution of the present disclosure, referring to FIG. 6 and FIG. 7, at least a part of the touch line TL may overlap with the common electrode 140 along the direction Z perpendicular to the plane of the display panel. A first slit 141 is formed in the common electrode 140. Along the direction Z perpendicular to the plane of the display panel, at least a part of the first slit 141 partially overlaps with the touch line TL, namely at least a part of the first slit 141 in the common electrode 140 exposes a part of the touch line TL.

The insulating layer between the touch line TL and the common electrode layer 14 is mainly the first inorganic insulating layer 15 or mainly the first inorganic insulating layer 15 and the second inorganic insulating layer 16. There is a small distance between the touch lines TL and the common electrode layer 14 along the direction Z perpendicular to the plane of the display panel. Consequently, between the touch line TL and the common electrode 140 overlapping with the touch line TL and not electrically connected to the touch line TL, the coupling capacitance and the signal interference are increased.

The first slit 141 partially overlapping with the touch line TL is formed in the common electrode 140. Between the common electrode 140 and the touch line TL along the direction perpendicular to the plane of the display panel, the overlapping area is reduced, the coupling capacitance is reduced, and the signal interference is effectively relieved.

Figure 8:
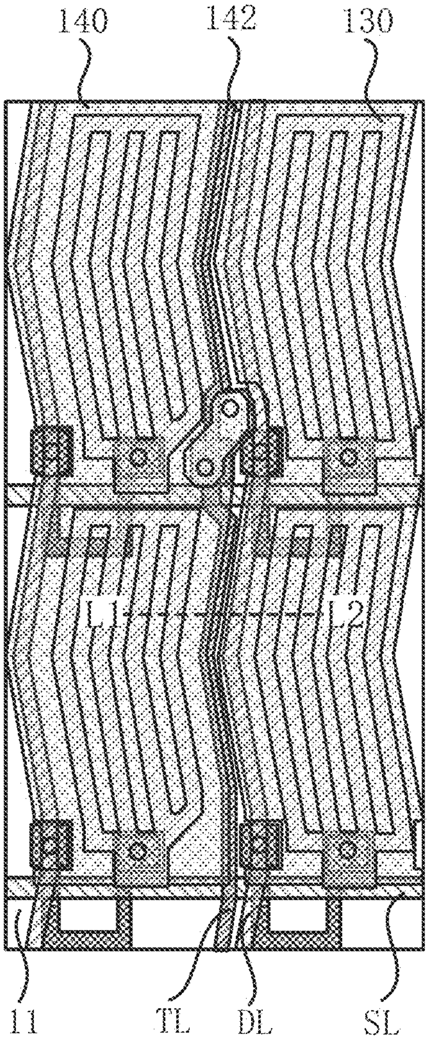
FIG. 8 is another schematic partial view of a first base plate of a display panel according to some embodiments of the present disclosure.
Figure 9:
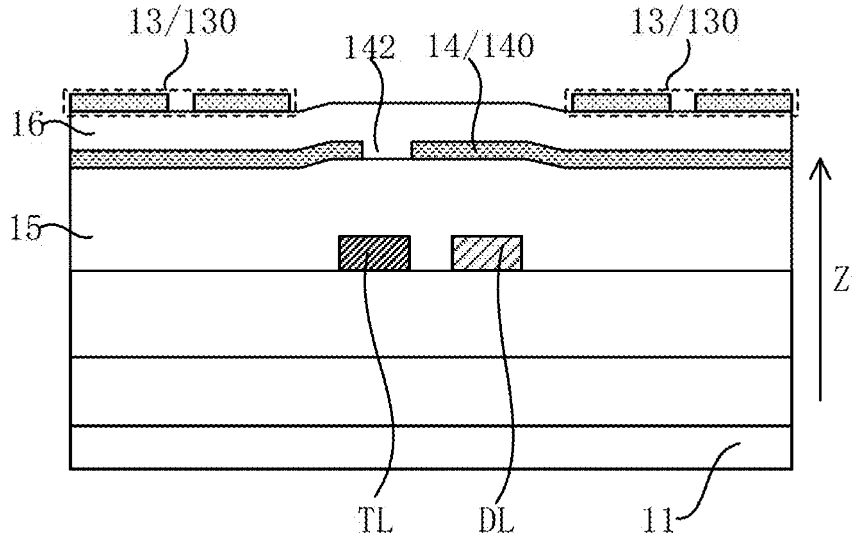
FIG. 9 is a schematic cross-sectional view along line L1-L2 shown in FIG. 8.

FIG. 8 is another schematic partial view of a first base plate of a display panel according to some embodiments of the present disclosure. FIG. 9 is a schematic cross-sectional view along line L1-L2 shown in FIG. 8.

In a technical solution of the present disclosure, referring to FIG. 8 and FIG. 9, a second slit 142 is formed between adjacent common electrodes 140. Along the direction Z perpendicular to the plane of the display panel, the second slit 142 at least partially overlaps with at least a part of the touch line TL. That is, a part of the touch line TL passes through the second slit 142, and the second slit 142 at least partially exposes the part of the touch line TL.

By arranging a part of the touch line TL at the second slit 142, the overlapping area between the part of the touch line TL and the common electrode 140 can be reduced, and thus the coupling capacitance and signal interference between the part of the touch line TL and the common electrode 140 are reduced.

In an implementation of the technical solution, a part of the touch line TL overlapping with the second slit 142 is completely exposed by the second slit 142.

Figure 10:
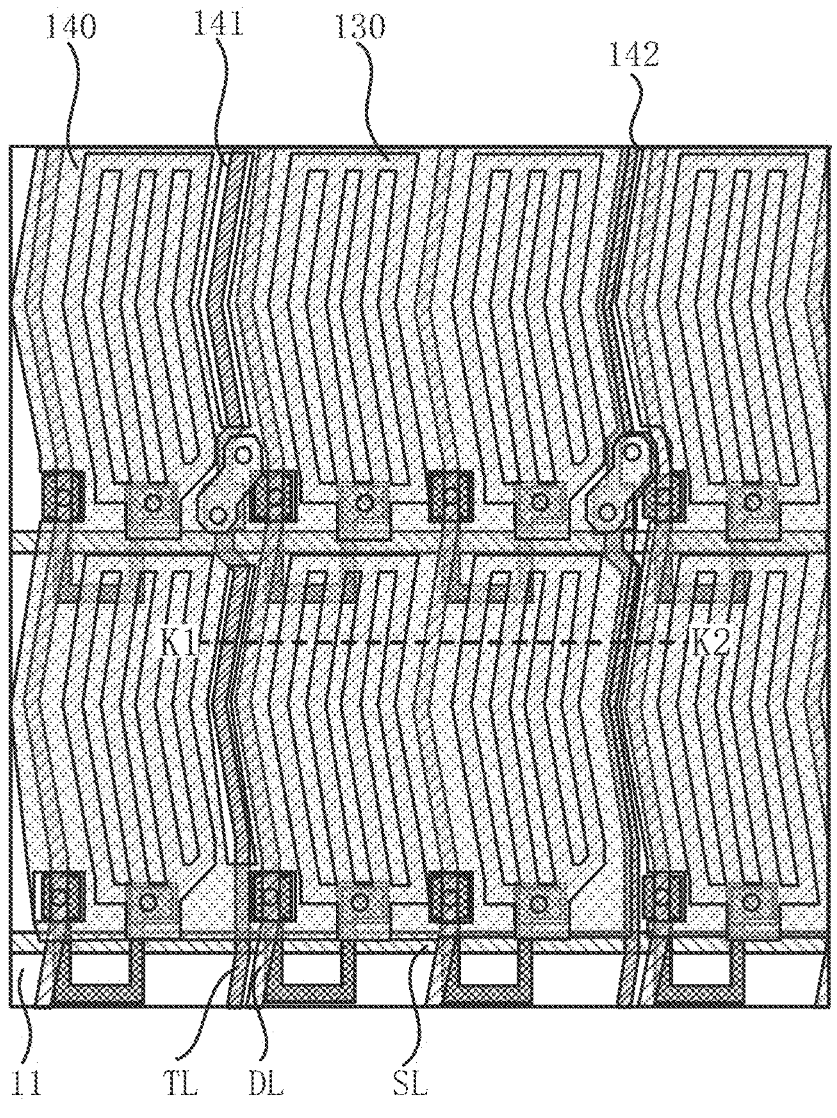
FIG. 10 is another schematic partial view of a first base plate of a display panel according to some embodiments of the present disclosure.
Figure 11:
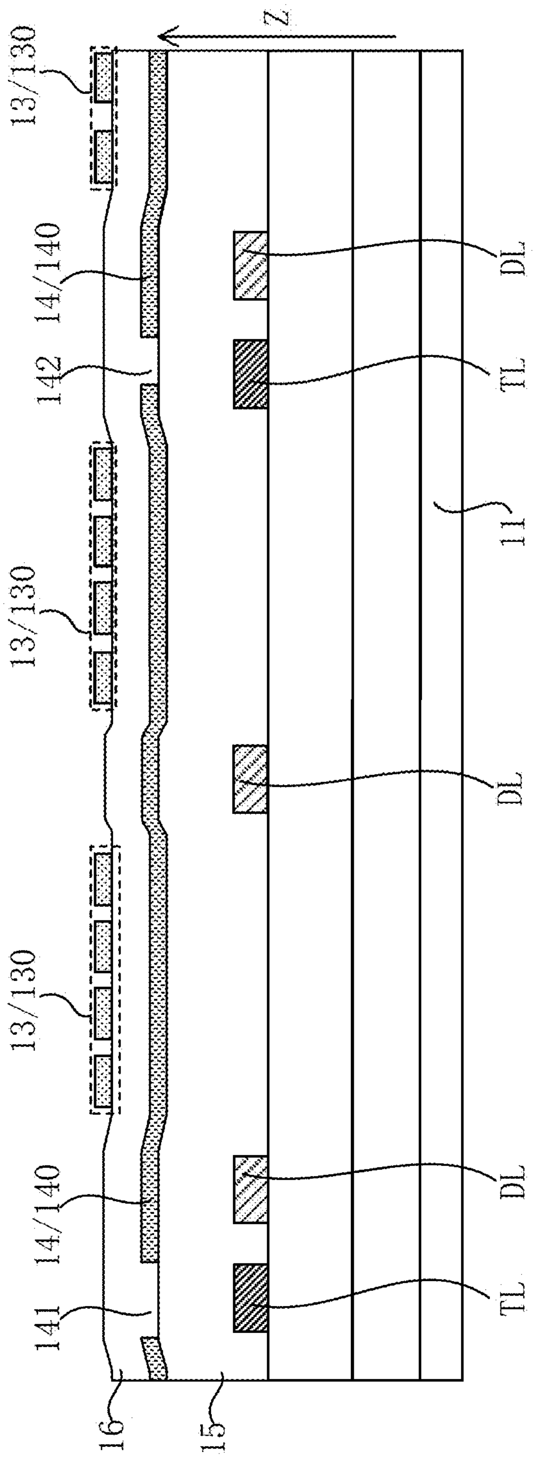
FIG. 11 is a schematic cross-sectional view along line K1-K2 shown in FIG. 10.

FIG. 10 is another schematic partial view of a first base plate of a display panel according to some embodiments of the present disclosure. FIG. 11 is a schematic cross-sectional view along line K1-K2 shown in FIG. 10.

In a technical solution of the present disclosure, referring to FIG. 10 and FIG. 11, a first slit 141 is formed in the common electrode 140 and a second slit 142 is formed between adjacent common electrodes 140. Along the direction Z perpendicular to the plane of the display panel, at least a part of the first slit 141 partially overlaps with the touch line TL, and the second slit 142 at least partially overlaps with at least a part of the touch line TL.

Figure 12:
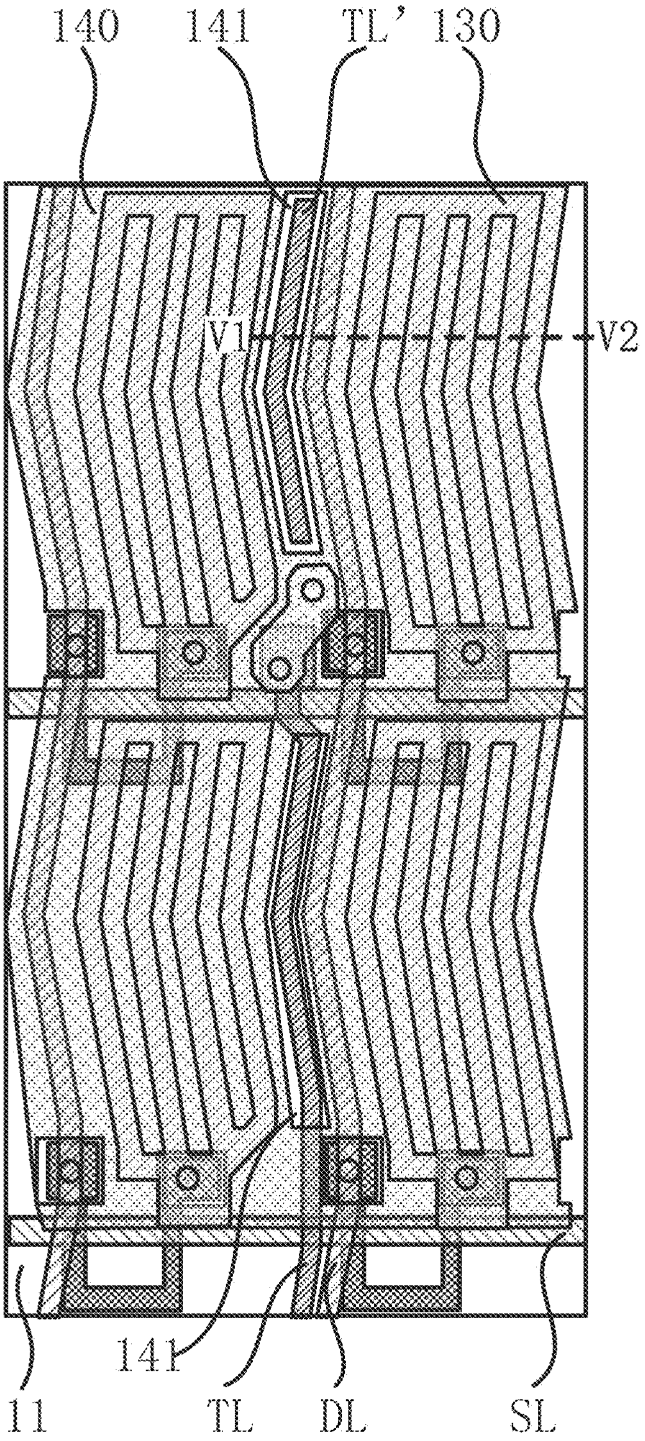
FIG. 12 is another schematic partial view of a first base plate of a display panel according to some embodiments of the present disclosure.
Figure 13:
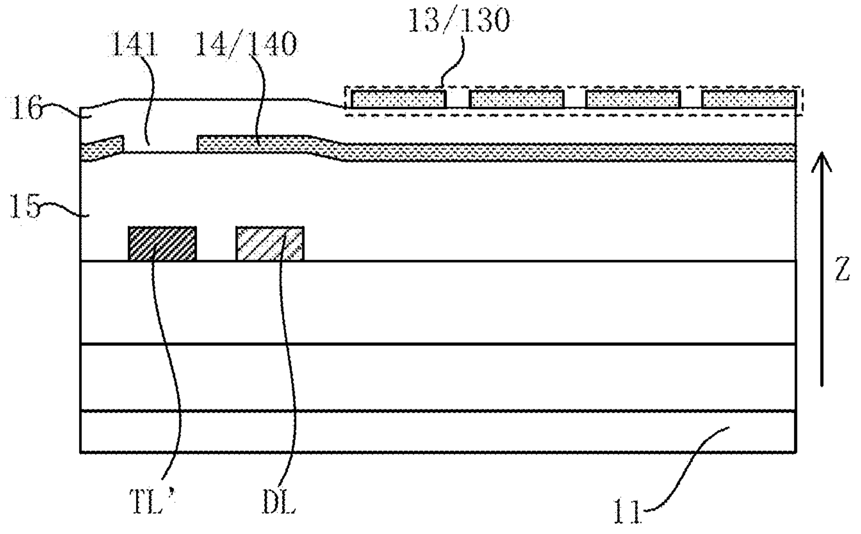
FIG. 13 is a schematic cross-sectional view along line V1-V2 shown in FIG. 12.

FIG. 12 is another schematic partial view of a first base plate of a display panel according to some embodiments of the present disclosure. FIG. 13 is a schematic cross-sectional view along line V1-V2 shown in FIG. 12.

In an embodiment of the present disclosure, referring to FIG. 12 and FIG. 13, the first base plate 01 includes a dummy touch line TL'. The dummy touch line TL' is provided in a same layer as the touch line TL and electrically insulated from the common electrode 140.

In an implementation of the embodiment, as shown in FIG. 12, the dummy touch line TL' may be provided on a same column with the touch line TL.

When the first slit 141 is formed in the common electrode 140, along the direction Z perpendicular to the plane of the display panel, a part of the first slit 141 partially overlaps with the touch line TL, and a part of the first slit 141 partially overlaps with the dummy touch line TL'. That is, a part of the first slit 141 in the common electrode 140 exposes a part of the touch line TL, and a part of the first slit 141 in the common electrode 140 exposes at least a part of the dummy touch line TL'.

Multiple touch lines TL in the first base plate 01 have different lengths. A longer touch line TL can overlap with the common electrode 140 more than a shorter touch line TL. Among the common electrodes 140 arranged along an extension direction of the touch line TL, at least two common electrodes 140 overlap with different numbers of the touch lines TL, and there are different numbers of the first slits 141 overlapping with the touch lines TL for the at least two common electrodes 140, which causes different loads on the at least two common electrodes 140.

By providing the dummy touch line TL' and the first slit 141 overlapping with the dummy touch line TL', the above problem can be solved. By providing the dummy touch line TL' and the first slit 141 overlapping with the dummy touch line TL1', the touch line TL and the dummy touch line TL1' can be taken as a set and can be distributed evenly, and the number of the first slits 141 on each common electrode 140 is also uniform. Such configuration prevents the problem of uneven display of the display panel arising from uneven distribution of the touch lines TL and uneven distribution of the first slits 141.

In some embodiments, along the extension direction of the touch line TL, different touch lines TL each overlap with a same number of the common electrodes 140, and the dummy touch line TL' located in the same column with the touch line TL may not be provided. For example, as shown in FIG. 10, a position where the touch line TL is electrically connected to the first common electrode 140 is not disconnected, and the touch line TL can overlap with the uppermost common electrode 140 and the lowest common electrode 140 in the display panel along a row direction.

In another implementation of the embodiment, the dummy touch line TL' may be arranged along a same direction with a plurality of the touch lines TL, the dummy touch line TL' may be basically as long as each of the touch lines TL, and a number of the common electrodes 140 overlapping with the dummy touch line TL' may be the same as a number of the common electrodes 140 overlapping with the touch line TL.

In some embodiments, the first slit 141 in the common electrode 140 may also overlap with the dummy touch line TL'. A number of the first slits 141 overlapping with the dummy touch line TL' may be the same as a number of the first slits 141 overlapping with the touch line TL.

Figure 14:
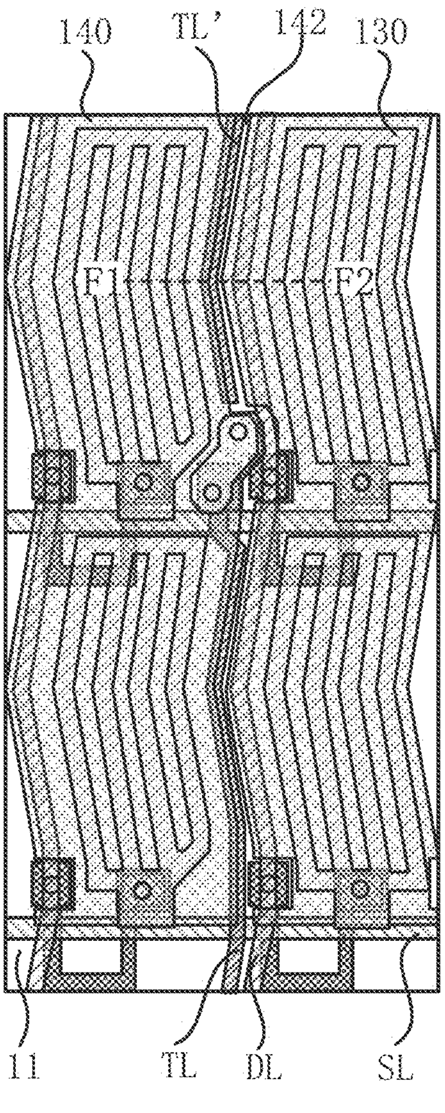
FIG. 14 is another schematic partial view of a first base plate of a display panel according to some embodiments of the present disclosure.
Figure 15:
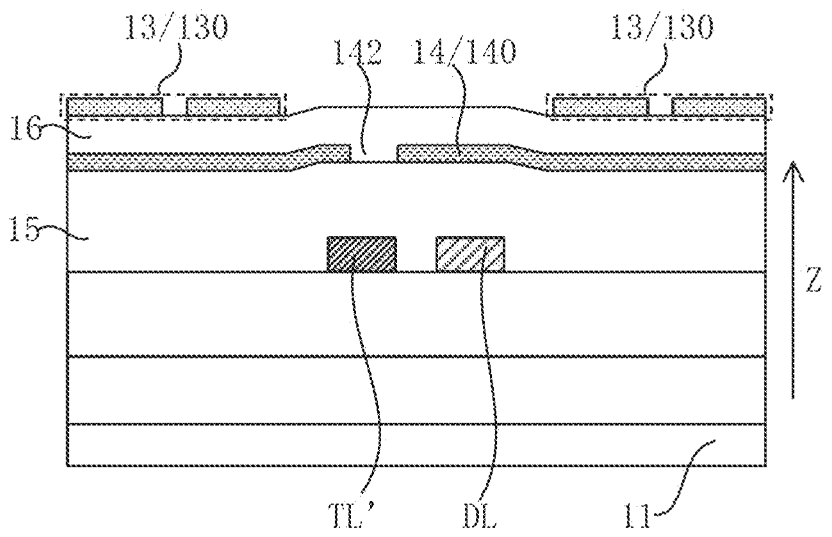
FIG. 15 is a schematic cross-sectional view along line F1-F2 shown in FIG. 14.

FIG. 14 is another schematic partial view of a first base plate of a display panel according to some embodiments of the present disclosure. FIG. 15 is a schematic cross-sectional view along line F1-F2 shown in FIG. 14.

In a technical solution of the present disclosure, referring to FIG. 14 and FIG. 15, a second slit 142 is formed between adjacent common electrodes 140. Along the direction Z perpendicular to the plane of the display panel, the second slit 142 at least partially overlaps with at least a part of the dummy touch line TL'. For example, the dummy touch line TL' at least partially overlapping with the second slit 142 and the touch line TL at least partially overlapping with the second slit 142 may be located in a same column.

Figure 16:
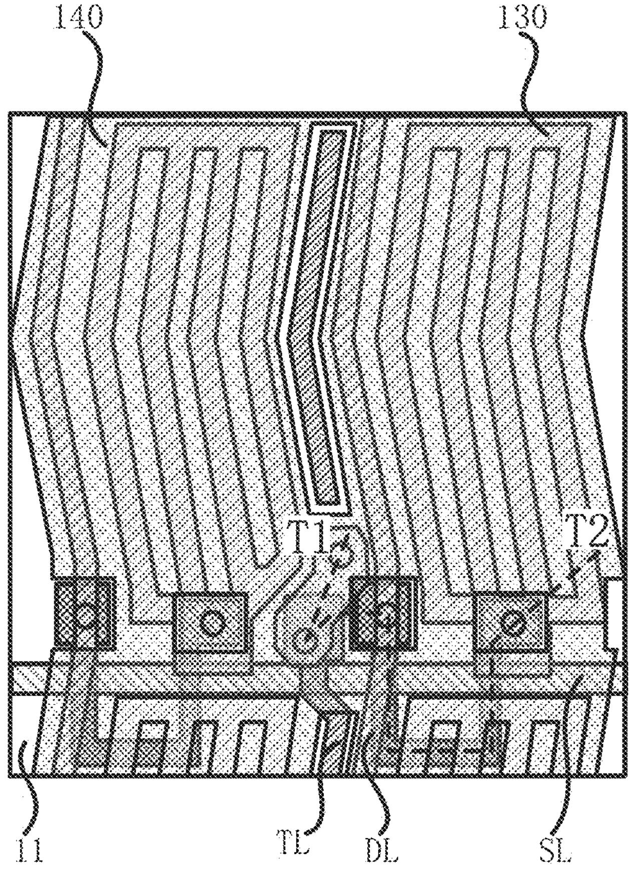
FIG. 16 is another schematic partial view of a first base plate of a display panel according to some embodiments of the present disclosure.
Figure 17:
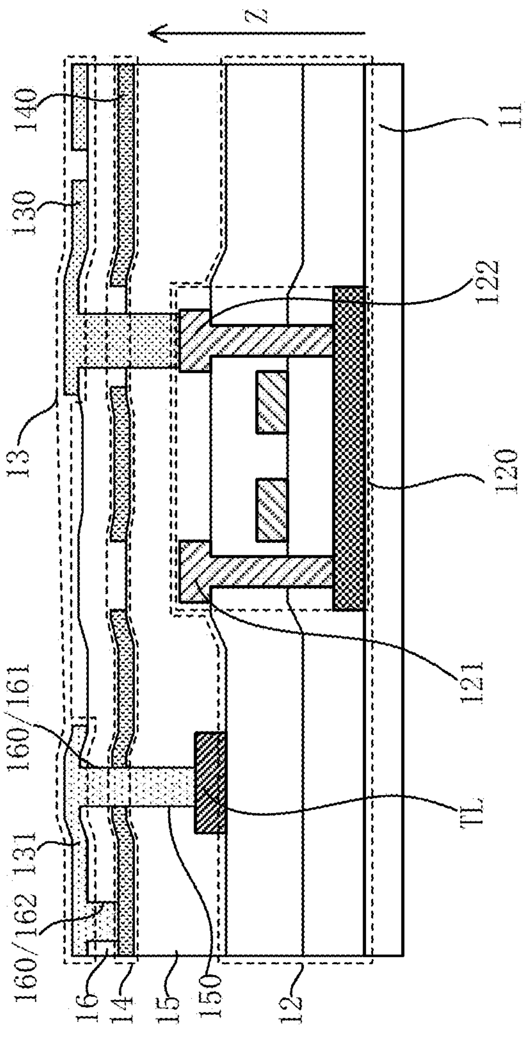
FIG. 17 is a schematic cross-sectional view along line T1-T2 shown in FIG. 16.

FIG. 16 is another schematic partial view of a first base plate of a display panel according to some embodiments of the present disclosure. FIG. 17 is a schematic cross-sectional view along line T1-T2 shown in FIG. 16.

In an embodiment of the present disclosure, referring to FIG. 16 and FIG. 17, the common electrode layer 14 is provided at a side of the pixel electrode layer 13 close to the transistor array layer 12, and the touch line TL is provided at a side of the common electrode layer 14 close to the first substrate 11. The pixel electrode layer 13 includes a bridge electrode 131 configured to electrically connect the touch line TL and the common electrode 140.

In a corresponding implementation of the embodiment, multiple first vias 150 are formed in the first inorganic insulating layer 15. Multiple second vias 160 are formed in the second inorganic insulating layer 16. A part of each of the second vias 160 communicates with each of the first vias 150. That is, the part of the second via 160 overlaps with the first via 150 along the direction Z perpendicular to the plane of the display panel. As shown in FIG. 17, the part of the second via 160 communicating with the first via 150 is labeled as the second via 161. In some embodiments, a part of the second via 160 does not overlap with the first via 150 along the direction Z perpendicular to the plane of the display panel. As shown in FIG. 17, the part of the second via 160 not overlapping with the first via 150 is labeled as the second via 162.

In the implementation, referring to FIG. 16 and FIG. 17, the bridge electrode 131 is electrically connected to the common electrode 140 through the second via 160, and the bridge electrode 131 is electrically connected to the touch line TL through the second via 160 and the first via 150 that are communicating with each other. In other words, the bridge electrode 131 is electrically connected to the common electrode 140 through the second via 162. The bridge electrode 131 is electrically connected to the touch line TL through the second via 161 and the first via 150.

In the embodiment of the present disclosure, the communicating first via 150 and second via 161 are respectively obtained by etching the first inorganic insulating layer 15 and the second inorganic insulating layer 16. Since the first inorganic insulating layer 15 and the second inorganic insulating layer 16 can form the vias with the same etching process, the communicating first via 150 and second via 161 can be formed in the same etching process. In addition, the second via 162 can also be formed with the second via 161 in the same etching process.

A case where the bridge electrode 131 is electrically connected to the common electrode 140 through the second via 160 refers to that the bridge electrode 131 is electrically connected to the common electrode 140 through a conductive structure in the second via 160. The conductive structure in the second via 160 may be a portion deposited in the second via 162 when the pixel electrode layer 13 is prepared.

A case where the bridge electrode 131 is electrically connected to the touch line TL through the communicating first via 150 and second via 160 refers to that the bridge electrode 131 is electrically connected to the common electrode 140 through a conductive structure in the communicating first via 150 and second via 160. The conductive structure in the communicating first via 150 and second via 160 may be a portion deposited in the second via 161 and a portion deposited in the first via 150 when the pixel electrode layer 13 is prepared.

Figure 18:
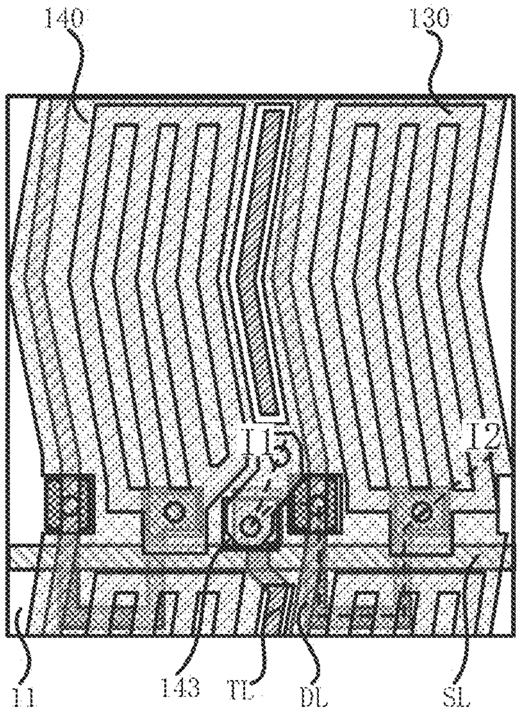
FIG. 18 is another schematic partial view of a first base plate of a display panel according to some embodiments of the present disclosure.
Figure 19:
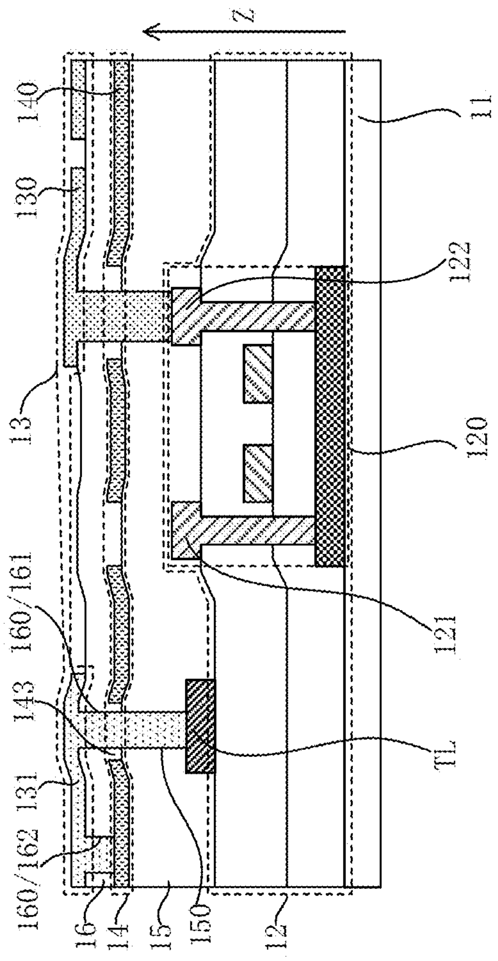
FIG. 19 is a schematic cross-sectional view along line 11-12 shown in FIG. 18.

FIG. 18 is another schematic partial view of a first base plate of a display panel according to some embodiments of the present disclosure. FIG. 19 is a schematic cross-sectional view along line 11-12 shown in FIG. 18.

In a technical solution of the present disclosure, referring to FIG. 18 and FIG. 19, first openings 143 are respectively formed in the common electrodes 140. Along the direction Z perpendicular to the plane of the display panel, the first opening 143 overlaps with the first via 150.

The first via 150 overlaps with the first opening 143 in the common electrode 140, which is equivalent to that an avoidance design is provided for the common electrode 140 in the region of the first via 150. This reduces the coupling capacitance between the common electrode 140 and the touch line TL.

Figure 20:
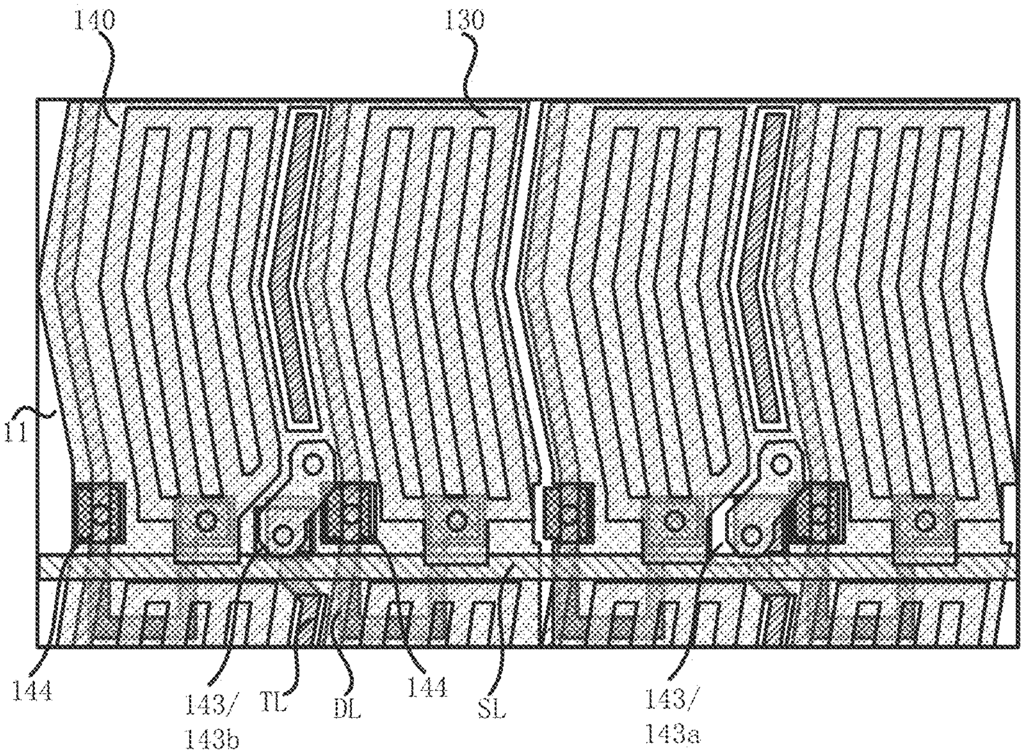
FIG. 20 is another schematic partial view of a first base plate of a display panel according to some embodiments of the present disclosure.

FIG. 20 is another schematic partial view of a first base plate of a display panel according to some embodiments of the present disclosure.

In an implementation, as shown in FIG. 20, at least two first openings 143 have different opening areas. For example, as shown in FIG. 20, the at least two first openings 143 include a first opening 143*a* and a first opening 143*b*. An opening area of the first opening 143*a* is greater than an opening area of the first opening 143*b*.

In the implementation, the areas of the first openings 143 can be provided flexibly according to different positions of the first openings 143. For example, when the first opening 143 is formed at a position of the common electrode 140, the first opening 143 may have a larger area in case of no other functional structure (such as the conductive structure) under the position. When the first opening 143 is formed at a position of the common electrode 140, the first opening 143 may have a smaller area in case of other functional structure (such as the conductive structure) under the position, so as not to damage the other functional structure. In addition, when the first opening 143 is provided at different positions of the common electrode 140, there may be different surrounding environments around the different positions. For example, the different positions have different heights, such that an etchant has different etching degrees for the first opening 143, and an area of the first opening 143 at the different positions is different.

In an embodiment of the present disclosure, the first base plate 01 includes a data line DL. The data line DL is configured to provide a signal to the pixel electrode 130. The data line DL may be electrically connected to the pixel electrode 130 through the transistor 120. The data line DL provides the correspondingly and electrically connected pixel electrode 130 with a data signal required by the display panel for light emission.

In the embodiment of the present disclosure, the data line DL is provided at a side of the common electrode 140 close to the first substrate 11. For example, the data line DL is provided at the side of the first inorganic insulating layer 15 close to the first substrate 11.

In a technical solution of the present disclosure, referring to FIG. 6 and FIG. 7 as well as FIG. 12 and FIG. 13, at least a part of the data line DL may overlap with the common electrode 140 along the direction Z perpendicular to the plane of the display panel. A slit is formed in the common electrode 140. Along the direction Z perpendicular to the plane of the display panel, the data line DL does not overlap with the slit in the common electrode 140. For example, as shown in FIG. 6 and FIG. 7 as well as FIG. 12 and FIG. 13, the first slit 141 is formed in the common electrode 140. Along the direction Z perpendicular to the plane of the display panel, the data line DL does not overlap with the slit 141. That is, in the technical solution, the part of the data line DL overlapping with the common electrode 140 is covered by a solid conductive portion of the common electrode 140.

The insulating layer between the data line DL and the common electrodes 140 is mainly the first inorganic insulating layer 15 or mainly the first inorganic insulating layer 15 and the second inorganic insulating layer 16. There is a small distance between the data line DL and the common electrode layer 14 along the direction Z perpendicular to the plane of the display panel. Consequently, a signal transmitted from the data line DL is riskier to interfere an electric field between the pixel electrode 130 and the common electrode 140.

For example, referring to FIG. 6 and FIG. 12, the leftmost data line DL is used as an example for description. When the data line DL provides a signal for the pixel electrode 130 on the first column and the first row. Because of a small distance between the data line DL and the common electrode 140, a strong electric field is generated between a potential of the signal transmitted from the data line DL and a potential of the common electrode 140. The strong electric field is also present at the pixel electrode 130 in the first column and the second row. Therefore, the signal transmitted on the data line DL is riskier to interfere display of a plurality of pixels.

When the electric field between the pixel electrode 130 and the common electrode 140 is used for driving a liquid crystal to deflect, the signal transmitted from the data line DL is riskier for the liquid crystal to cause false deflection.

In the technical solution, the part of the data line DL overlapping with the common electrode 140 is covered by the solid conductive portions of the common electrode 140. The common electrode 140 can prevent the electric field between the data line DL and the common electrode 140 from propagating to a side of the common electrode 140 away from the first substrate 11, thereby effectively solving the above problem.

In a technical solution of the present disclosure, referring to FIG. 8 and FIG. 9 as well as FIG. 14 and FIG. 15, a slit is formed between adjacent ones of the common electrodes 140. Along the direction Z perpendicular to the plane of the display panel, the data line DL does not overlap with at least a part of the slit between the adjacent common electrodes 140.

For example, as shown in FIG. 8 and FIG. 9 as well as FIG. 14 and FIG. 15, the second slit 142 is formed in the adjacent common electrodes 140. Along the direction Z perpendicular to the plane of the display panel, the data line DL does not overlap with the second slit 142. It is to be noted that an extension direction of the second slit 142 is basically parallel to an extension direction of the data line DL.

The solution can also effectively solve the interference of the signal from the data line DL on the electric field between the pixel electrode 130 and the common electrode 140.

In an embodiment of the present disclosure, referring to FIG. 10 and FIG. 11, along the direction Z perpendicular to the plane of the display panel, the data line DL does not overlap with the slit in the common electrode 140, and the data line DL does not overlap with at least a part of the slit between the adjacent common electrodes 140.

Figure 21:
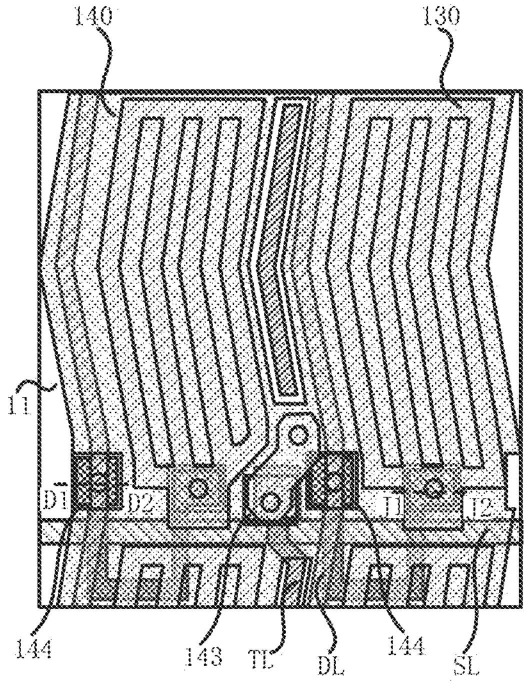
FIG. 21 is another schematic partial view of a first base plate of a display panel according to some embodiments of the present disclosure.
Figure 22:
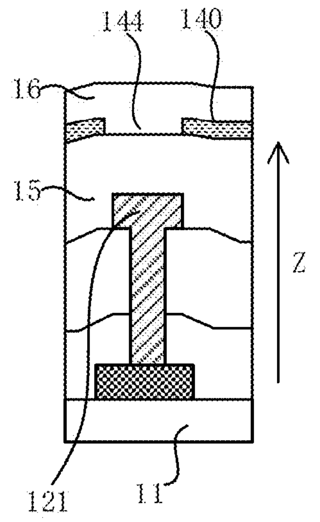
FIG. 22 is a schematic cross-sectional view along line D1-D2 shown in FIG. 21.

FIG. 21 is another schematic partial view of a first base plate of a display panel according to some embodiments of the present disclosure. FIG. 22 is a schematic cross-sectional view along line D1-D2 shown in FIG. 21.

In an embodiment of the present disclosure, referring to FIG. 21 and FIG. 22, the transistor 120 includes a first electrode 121 electrically connected to the data line DL, and a second electrode 122 electrically connected to the pixel electrode 130. For example, a source of the transistor 120 serves as the first electrode 121, and a drain of the transistor 120 serves as the second electrode 122. The data line DL is electrically connected to a plurality of the pixel electrodes 130 through a plurality of the transistors 120.

In a technical solution of the present disclosure, referring to FIG. 21 and FIG. 22, second openings 144 are respectively formed in the common electrodes 140. Along a direction Z perpendicular to a plane of the display panel, the second opening 144 at least partially overlaps with the first electrode 121 of the transistor 120. That is, along the direction Z perpendicular to the plane of the display panel, a hollow-out portion is provided at a position of the common electrode 140 overlapping with the first electrode 121 of the transistor 120. This can reduce interference of the signal from the first electrode 121 of the transistor 120 on the common electrode 140.

Figure 23:
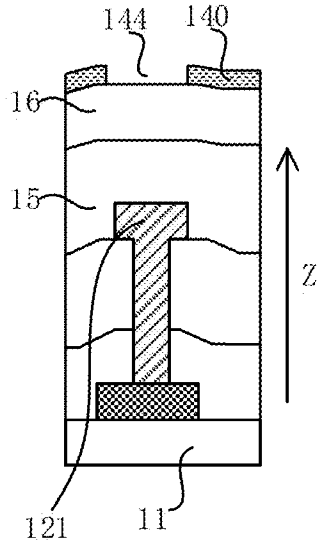
FIG. 23 is another schematic cross-sectional view along line D1-D2 shown in FIG. 21.

FIG. 23 is another schematic cross-sectional view along line D1-D2 shown in FIG. 21.

In an implementation, as shown in FIG. 22, the common electrode layer 14 is provided at a side of the pixel electrode layer 13 close to the first substrate 11. With the second opening 144 in the common electrode 140, electrical conduction between the common electrode 140 and the data line DL is prevented when the first electrode 121 of the transistor 120 is electrically connected to the data line DL through the via.

In an implementation, as shown in FIG. 23, the pixel electrode layer 13 is provided at a side of the common electrode layer 14 close to the first substrate 11. In this case, the second opening 144 can still be formed in the common electrode 140.

Figure 24:
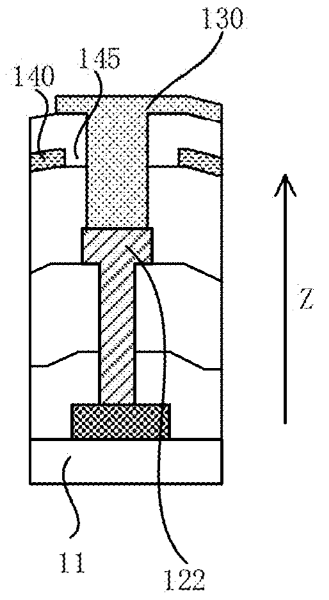
FIG. 24 is a schematic cross-sectional view along line J1-J2 shown in FIG. 21.

FIG. 24 is a schematic cross-sectional view along line J1-J2 shown in FIG. 21.

In a technical solution of the present disclosure, referring to FIG. 21 and FIG. 24, third openings 145 are respectively formed in the common electrodes 140. Along the direction Z perpendicular to the plane of the display panel, the third opening 145 at least partially overlaps with the second electrode 122 of the transistor 120. That is, along the direction Z perpendicular to the plane of the display panel, a hollow-out portion is provided at a position of the common electrode 140 overlapping with the second electrode 122 of the transistor 120. This can reduce interference of the signal from the second electrode 122 of the transistor 120 on the common electrode 140.

Figure 25:
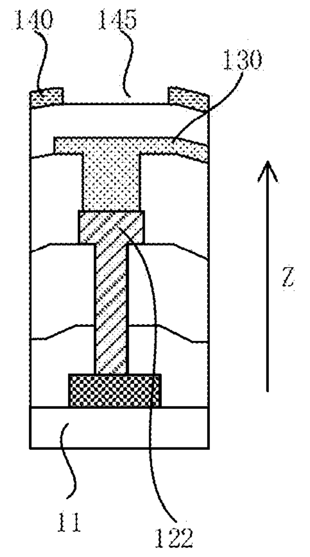
FIG. 25 is another schematic cross-sectional view along line J1-J2 shown in FIG. 21.

FIG. 25 is another schematic cross-sectional view along line J1-J2 shown in FIG. 21.

In an implementation, as shown in FIG. 24, the common electrode layer 14 is provided at a side of the pixel electrode layer 13 close to the first substrate 11. With the third opening 145 in the common electrode 140, electrical conduction between the common electrode 140 and the pixel electrode 130 is prevented when the second electrode 122 of the transistor 120 is electrically connected to the pixel electrode 130 through the via.

In an implementation, as shown in FIG. 25, the pixel electrode layer 13 is provided at a side of the common electrode layer 14 close to the first substrate 11. In this case, the third opening 145 can still be formed in the common electrode 140.

In a technical solution of the present disclosure, as shown in FIG. 21, the second opening 144 and the third opening 145 are formed in the common electrode 140. Along the direction Z perpendicular to the plane of the display panel, the second opening 144 at least partially overlaps with the first electrode 121 of the transistor 120, and the third opening 145 at least partially overlaps with the second electrode 122 of the transistor 120.

Figure 26:
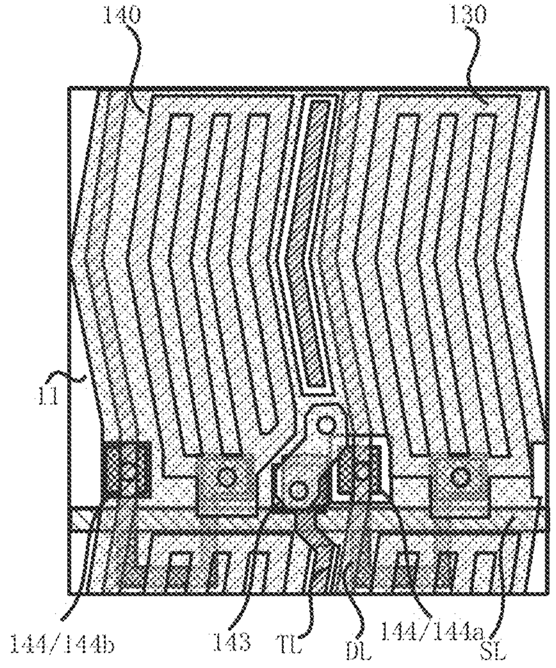
FIG. 26 is another schematic partial view of a first base plate of a display panel according to some embodiments of the present disclosure.
Figure 27:
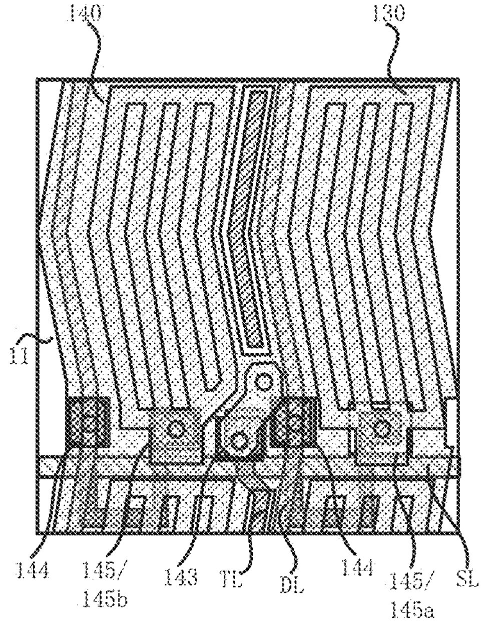
FIG. 27 is another schematic partial view of a first base plate of a display panel according to some embodiments of the present disclosure.
Figure 28:
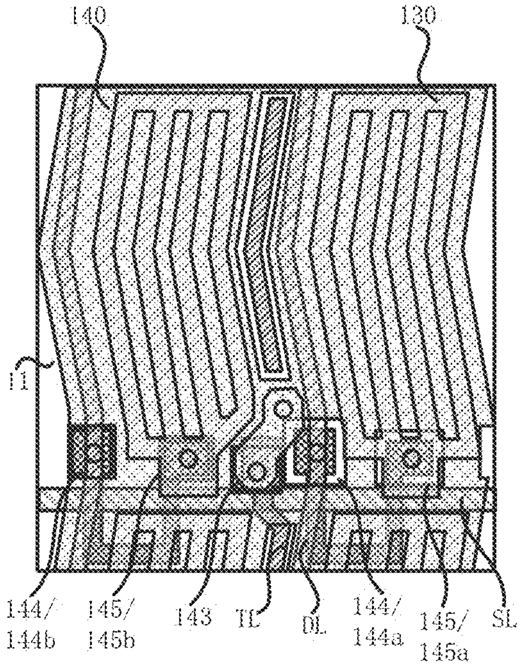
FIG. 28 is another schematic partial view of a first base plate of a display panel according to some embodiments of the present disclosure.

FIG. 26 is another schematic partial view of a first base plate of a display panel according to some embodiments of the present disclosure. FIG. 27 is another schematic partial view of a first base plate of a display panel according to some embodiments of the present disclosure. FIG. 28 is another schematic partial view of a first base plate of a display panel according to some embodiments of the present disclosure.

In a technical solution of the present disclosure, referring to FIG. 26 and FIG. 28, when the second openings 144 are respectively formed in the common electrodes 140, at least two of the second openings 144 have different opening areas. For example, as shown in FIG. 26 and FIG. 28, the at least two second openings 144 include a second opening 144*a* and a second opening 144*b*. An opening area of the second opening 144*a* is greater than an opening area of the second opening 144*b*.

In the implementation, the areas of the second openings 144 can be provided flexibly according to different positions of the second openings 144. For example, when the second opening 144 is formed at a position of the common electrode 140, the second opening 144 may have a larger area in case of no other functional structure (such as the conductive structure) under the position. When the second opening 144 is formed at a position of the common electrode 140, the second opening 144 may have a smaller area in case of other functional structure (such as the conductive structure) under the position, so as not to damage the other functional structure. In addition, when the second opening 144 is provided at different positions of the common electrode 140, there may be different surrounding environments around the different positions. For example, the different positions have different heights, such that an etchant has different etching degrees for the second opening 144, and an area of the second opening 144 at the different positions is different.

In a technical solution of the present disclosure, referring to FIG. 27 and FIG. 28, when the third openings 145 are respectively formed in the common electrodes 140, at least two of the third openings 145 have different opening areas. For example, as shown in FIG. 27 and FIG. 28, the at least two third openings 145 include a second opening 145*a* and a third opening 145*b*. An opening area of the third opening 145*a* is greater than an opening area of the third opening 145*b*.

In the implementation, the areas of the third openings 145 can be provided flexibly according to different positions of the third openings 145. For example, when the third opening 145 is formed at a position of the common electrode 140, the third opening 145 may have a larger area in case of no other functional structure (such as the conductive structure) under the position. When the third opening 145 is formed at a position of the common electrode 140, the third opening 145 may have a smaller area in case of other functional structure (such as the conductive structure) under the position, so as not to damage the other functional structure. In addition, when the third opening 145 is provided at different positions of the common electrode 140, there may be different surrounding environments around the different positions. For example, the different positions have different heights, such that an etchant has different etching degrees for the third opening 145, and an area of the third opening 145 at the different positions is different.

In an embodiment of the present disclosure, as shown in FIG. 16 and FIG. 17 as well as FIG. 18 and FIG. 19, the first base plate 01 includes a data line DL and a touch line TL. The data line DL and the touch line TL are provided in a same layer. The data line DL is electrically connected to the pixel electrode 130, and the touch line TL is electrically connected to the common electrodes 140.

The data line DL and the touch line TL are provided in a same layer. The insulating layer between each of the data line DL and the touch line TL and the pixel electrode 130 is the inorganic insulating layer. The insulating layer between each of the data line DL and the touch line TL and the common electrode 140 is also the inorganic insulating layer.

The via for electrically connecting the touch line TL and the common electrode 140 and the via for electrically connecting the data line DL and the pixel electrode 130 can be prepared in a same process, thereby reducing the preparation difficulty. In some embodiments, the via for electrically connecting the pixel electrode 130 and the data line DL and the via for electrically connecting the common electrode 140 and the touch line TL can be prepared in the same etching process. By providing the data line DL and the touch line TL on the same layer, the touch line TL and the data line DL can be prepared at the same time with a same manufacture procedure and a same mask. This reduces the manufacture process and saves the cost.

To sum up, the common electrode 140 can be multiplexed as the touch electrode. The touch line TL and the data line DL can be prepared at the same time. The via for electrically connecting the touch line TL and the common electrode 140 and the via for electrically connecting the data line DL and the pixel electrode 130 can be prepared at the same time. Therefore, when the display panel provided by the present disclosure is integrated with the structure having the touch function, both the manufacture process and the mask are not increased at all.

Figure 29:
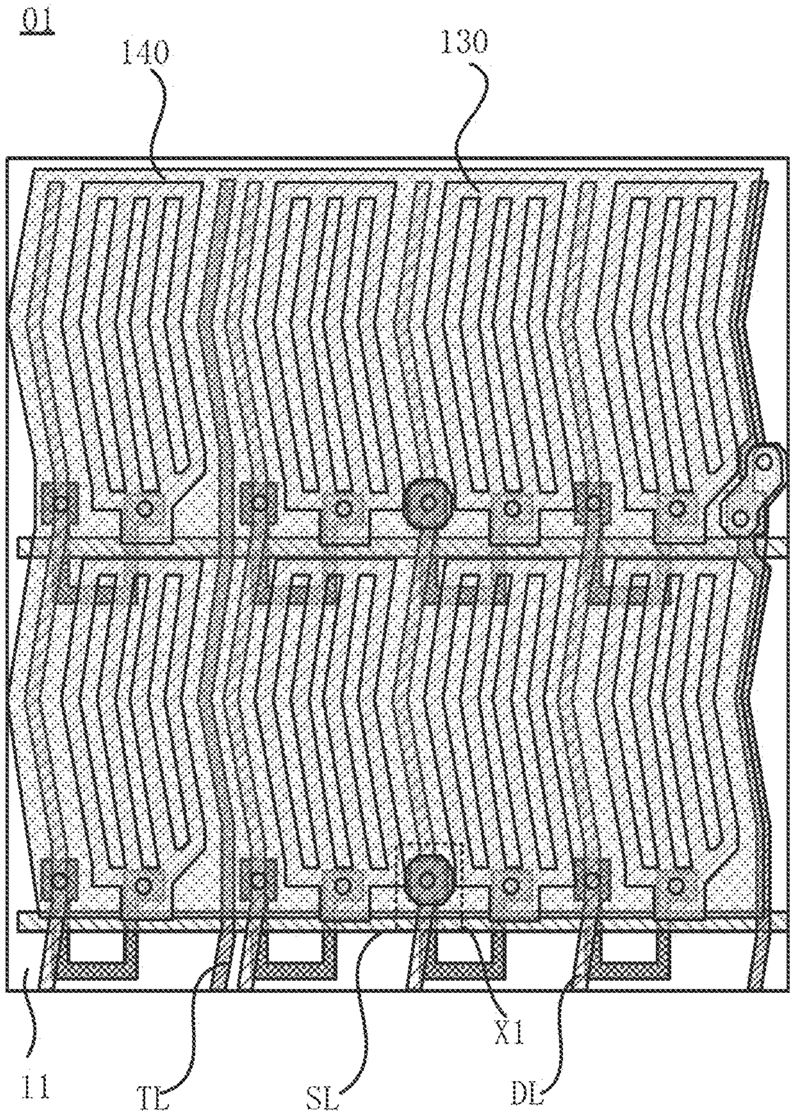
FIG. 29 is a schematic partial view of a display panel according to some embodiments of the present disclosure.
Figure 30:
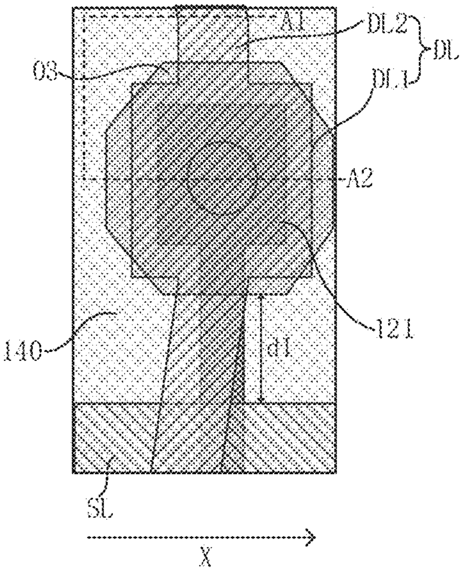
FIG. 30 is a schematic partial view of a region X1 shown in FIG. 29.
Figure 31:
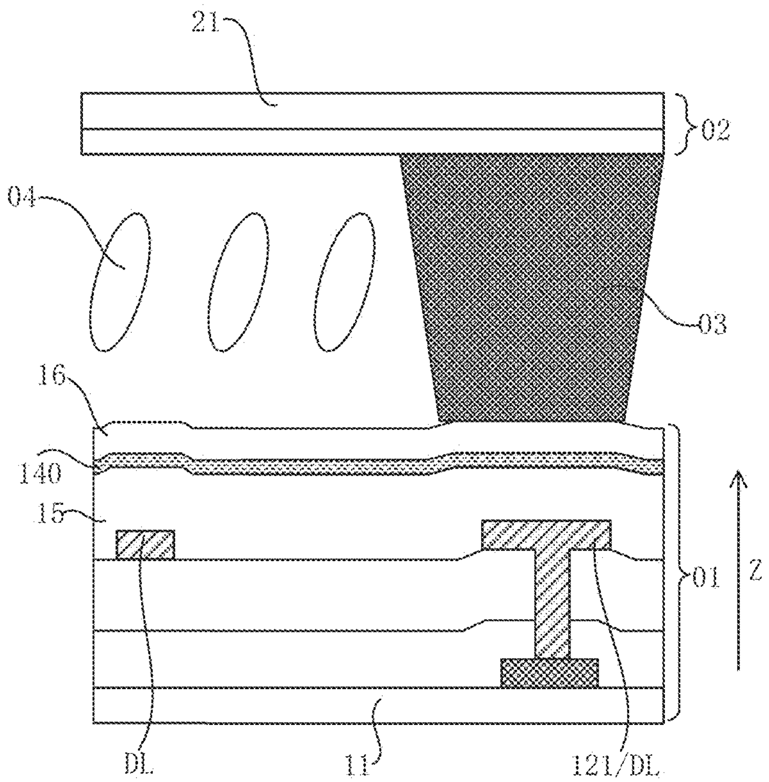
FIG. 31 is a schematic cross-sectional view along line A1-A2 shown in FIG. 30.

FIG. 29 is a schematic partial view of a display panel according to some embodiments of the present disclosure. FIG. 30 is a schematic partial view of a region X1 shown in FIG. 29. FIG. 31 is a schematic cross-sectional view along line A1-A2 shown in FIG. 30.

In an embodiment of the present disclosure, referring to FIG. 29, FIG. 30 and FIG. 31, the display panel includes a second base plate 02 and a support pillar 03. The second base plate 02 includes a second substrate 21. In addition, the second base plate 02 may include a structure such as a black matrix and a color resistor.

The support pillar 03 is provided between the first substrate 11 and the second substrate 21, and is configured to form a certain space between the first base plate 01 and the second base plate 02. The support pillar 03 may be provided on the first base plate 01, and formed in preparation of the first base plate 01. The support pillar 03 may also be provided on the second base plate 02, and formed in preparation of the second base plate 02.

In some embodiments, the display panel may include a display dielectric layer 04. The display dielectric layer 04 may be located between the first base plate 01 and the second base plate 02. The display dielectric layer 04 may include a liquid crystal. The display panel provided by the embodiment of the present disclosure may be an LCD panel.

Referring to FIG. 29, FIG. 30 and FIG. 31, the first base plate 01 includes a scan line SL and a data line DL. An extension direction of the scan line SL is intersected with an extension direction of the data line DL. For example, as shown in FIG. 29, the scan line SL extends along a row direction, and the data line DL extends along a column direction. The extension direction of the scan line SL is basically perpendicular to the extension direction of the data line DL.

In the embodiment of the present disclosure, along a direction Z perpendicular to the plane of the display panel, the support pillar 03 does not overlap with at least one of the scan line SL and the data line DL. That is, the support pillar 03 does not overlap with the scan line SL and the data line DL at the same time. It is to be understood that the support pillar 03 is not provided at an intersection between the scan line SL and the data line DL.

Usually, the scan line SL is electrically connected to a gate of the transistor 120, and the data line DL is electrically connected to the first electrode 12 of the transistor 120. The scan line SL and the data line DL are usually provided in a same layer with a sub-layer of the transistor array layer 12, namely the scan line SL and the data line DL are located at a side of the first inorganic insulating layer 15 toward the first substrate 11. Due to effective planarization of the inorganic insulating layer, a protrusion at the intersection between the scan line SL and the data line DL is obvious, although the first inorganic insulating layer 15 and the second inorganic insulating layer 16 are provided at a side of the scan line SL away from the first substrate 11 and a side of the data line DL away from the first substrate 11. If the support pillar 03 is provided at the intersection between the scan line SL and the data line DL, the support pillar 03 will be poor in stability.

By keeping the support pillar 03 away from the intersection between the scan line SL and the data line DL, the embodiment of the present disclosure can ensure the stability of the support pillar 03 as much as possible.

In a technical solution of the present disclosure, referring to FIG. 29, FIG. 30 and FIG. 31, along the direction Z perpendicular to the plane of the display panel, the support pillar 03 overlaps with at least a part of the data line DL, and does not overlap with the scan line SL. By allowing the support pillar 03 to overlap with the data line DL along the direction Z perpendicular to the plane of the display panel, the support pillar does not have a large footprint to affect an opening area of a sub-pixel in the display panel.

As shown in FIG. 30, in a technical solution of the present disclosure, a minimum distance d1 between orthographic projection of the support pillar 03 on the first substrate 11 and orthographic projection of the scan line SL on the first substrate 11 is greater than 0 namely the orthographic projection of the support pillar 03 on the first substrate 11 does not overlap with the orthographic projection of the scan line SL on the first substrate 11. For example, d1 may be 0.5 μm, 1 μm, 1.5 μm, etc.

For example, when the d1 is greater than or equal to 2 the support pillar 03 can safely avoid the protrusion at the intersection between the scan line SL and the data line DL, and a position of the support pillar 03 is not affected.

In a technical solution of the present disclosure, as shown in FIG. 30, the data line DL includes a first portion DL1 and a second portion DL2. A width of the first portion DL1 along a first direction X is greater than a width of the second portion DL2 along the first direction X. The first direction X is perpendicular to the extension direction of the data line DL. A position in the data line DL is widened to form the first portion DL1.

Along the direction Z perpendicular to the plane of the display panel, at least a part of the support pillar 03 overlaps with the first portion DL1, and at least a part of the support pillar 03 is provided above the widened first portion DL1 in the data line DL. Because of a larger width of the first portion DL1, a relatively flat and large bearing surface can be provided for the support pillar 03 overlapping with the first portion DL1.

Since the support pillar 03 does not overlap with the scan line SL, the first portion DL1 does not overlap with the scan line SL. Although the first portion DL1 is wider than the second portion DL2, coupling between the scan line SL and the data line DL may not be increased.

Figure 32:
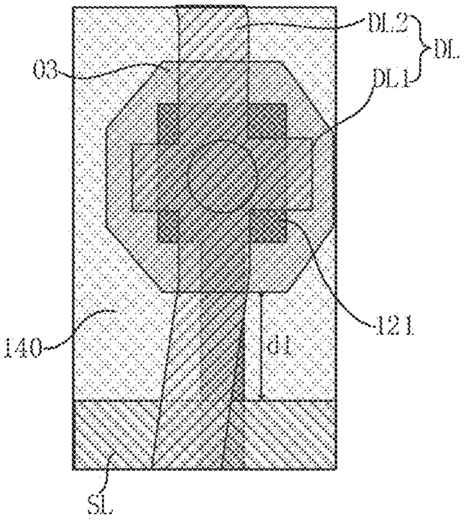
FIG. 32 is another schematic partial view of a region X1 shown in FIG. 29.

FIG. 32 is another schematic partial view of a region X1 shown in FIG. 29.

In an implementation, as shown in FIG. 32, at least a part of the first portion DL1 has a cross-shaped peripheral contour.

With the cross-shaped peripheral contour of the first portion DL1, the stability of the support pillar 03 can be effectively ensured by the bearing surface contacting the support pillar 03, and the data line DL does not change a resistance suddenly at the first portion DL1.

In an implementation, referring to FIG. 31, FIG. 30 and FIG. 32, the first electrode 121 of the transistor 120 is electrically connected to the data line DL, and the second electrode 122 of the transistor 120 is electrically connected to the pixel electrode 130. Along the direction Z perpendicular to the plane of the display panel, the first portion DL1 overlaps with the first electrode 121 of the transistor 120, and the support pillar 03 overlapping with the first portion DL1 overlaps with the first electrode 121 of the transistor 120.

The data line DL is provided in a same layer with the first electrode 121 of the transistor 120, and electrically connected to a semiconductor layer in the first electrode 121 of the transistor 120. It is to be understood that a part of the data line DL electrically connected to the semiconductor layer of the transistor 120 through the via forms the first electrode 121 of the transistor 120. The support pillar 03 overlaps with the first electrode 121 of the transistor 120 along the direction Z perpendicular to the plane of the display panel, which optimizes the position of the support pillar 03, and reduces influences of the support pillar 03 on a light emitting area of the pixel.

Figure 33:
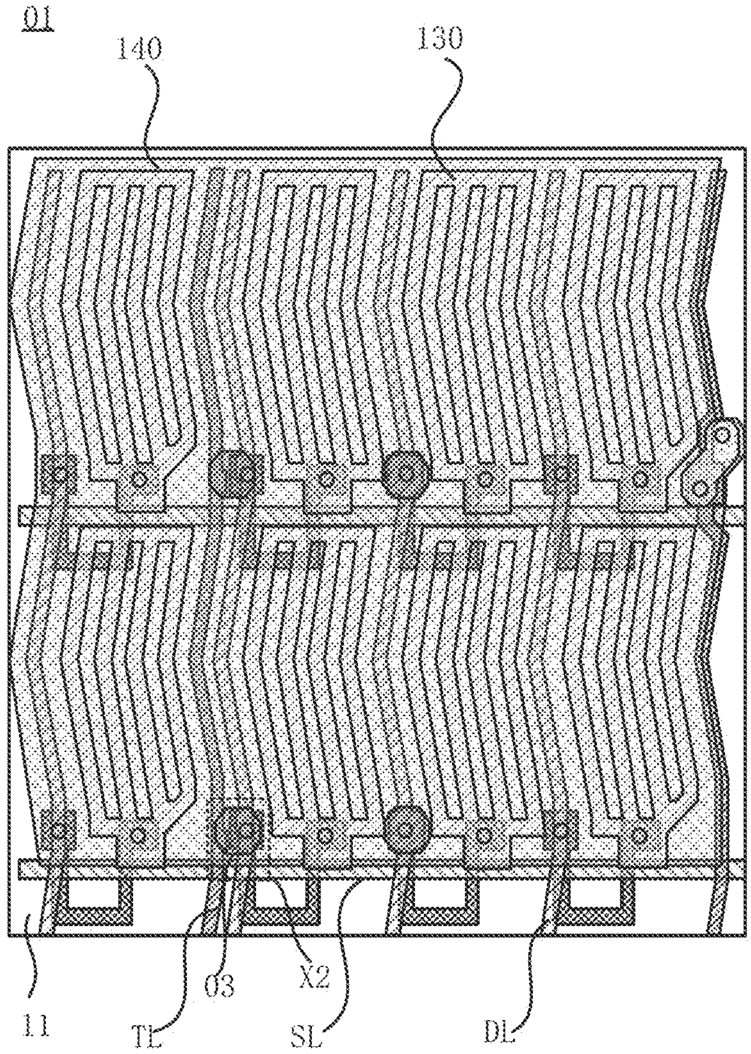
FIG. 33 is another schematic partial view of a display panel according to some embodiments of the present disclosure.
Figure 34:
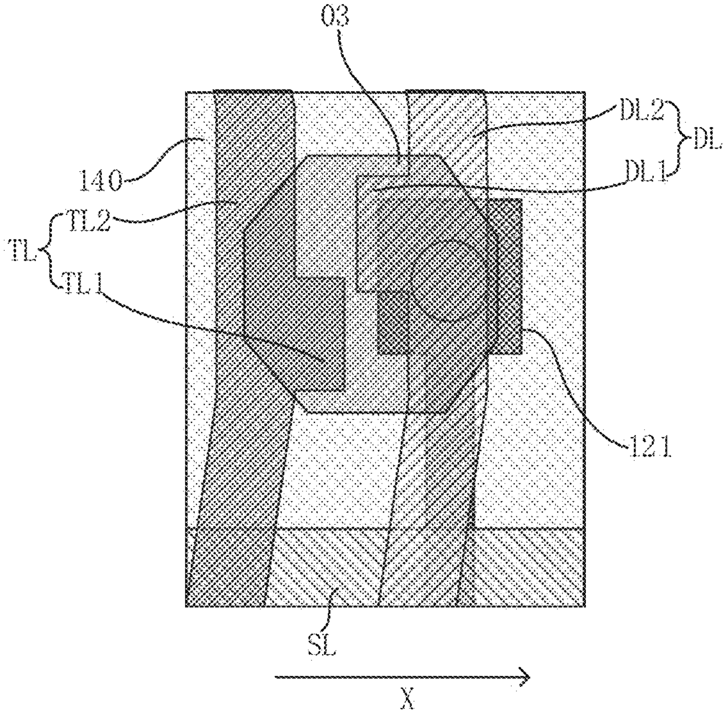
FIG. 34 is a schematic partial view of a region X2 shown in FIG. 33.

FIG. 33 is another schematic partial view of a display panel according to some embodiments of the present disclosure. FIG. 34 is a schematic partial view of a region X2 shown in FIG. 33.

In a technical solution of the present disclosure, referring to FIG. 33 and FIG. 34, when the first base plate 01 includes the touch line TL, an extension direction of the touch line TL is the same as the extension direction of the data line DL. For example, as shown in FIG. 33, the touch line TL and the data line DL each extend along the column direction. Along the direction Z perpendicular to the plane of the display panel, the support pillar 03 overlaps with at least a part of the touch line TL.

The touch line TL includes a third portion TL1 and a third portion TL2. A width of the third portion TL1 along the first direction is greater than a width of the fourth portion TL2 along the first direction X. The first direction X is perpendicular to the extension direction of the touch line TL. A position in the touch line TL is widened to form the third portion TL1.

Along the direction Z perpendicular to the plane of the display panel, at least a part of the support pillar 03 overlaps with the third portion TL1, and at least a part of the support pillar 03 is provided above the widened third portion TL1 in the touch line TL. Because of a larger width of the third portion TL1, a relatively flat and large bearing surface can be provided for the support pillar 03 overlapping with the third portion TL1.

In a technical solution of the present disclosure, referring to FIG. 33 and FIG. 34, the touch line TL is adjacent to at least one data line DL, namely the touch line TL and the data line DL that are adjacent to each other are located in a gap between same pixel electrodes 130. The gap between the same pixel electrodes 130 refers to a gap between adjacent pixel electrodes 130. In this case, the adjacent touch line TL and data line DL may respectively include the third portion TL1 and the first portion DL1. The support pillar 03 may overlap with the third portion TL1 and the first portion DL1 at the same time along the direction Z perpendicular to the plane of the display panel.

Due to a brittle texture and the like of the inorganic insulating layer, the inorganic insulating layer may not be too thick. When the insulating layer between each of the touch line TL and the data line DL, and each of the common electrode 140 and the pixel electrode 130 is the inorganic insulating layer, there is a thin insulating layer at a side of the touch line TL toward the second base plate 02 and at a side of the data line DL toward the second base plate 02, and the thin insulating layer does not have the desirable planarization effect. In this case, a surface of a region with the touch line TL and the data line DL in the first base plate 01 toward the second base plate 02 has the poor planarization effect. If the surface of the region toward the second base plate 02 is directly used to bear the support pillar 03, the support pillar 03 is unstable.

In the technical solution, the first portion DL1 is equivalent to widening the portion of the data line DL overlapping with the support pillar 03, and the third portion DL3 is equivalent to widening the portion of the touch line TL overlapping with the support pillar 03. In a surface of a region with the first portion DL1 and the third portion DL3 in the first base plate 01 toward the second base plate 02, an area with good planarization is increased. Therefore, the support pillar 03 is stable.

Meanwhile, the third portion TL1 of the touch line TL is not excessively wider than the fourth portion TL2, such that the resistance of the touch line TL is not changed suddenly.

Figure 35:
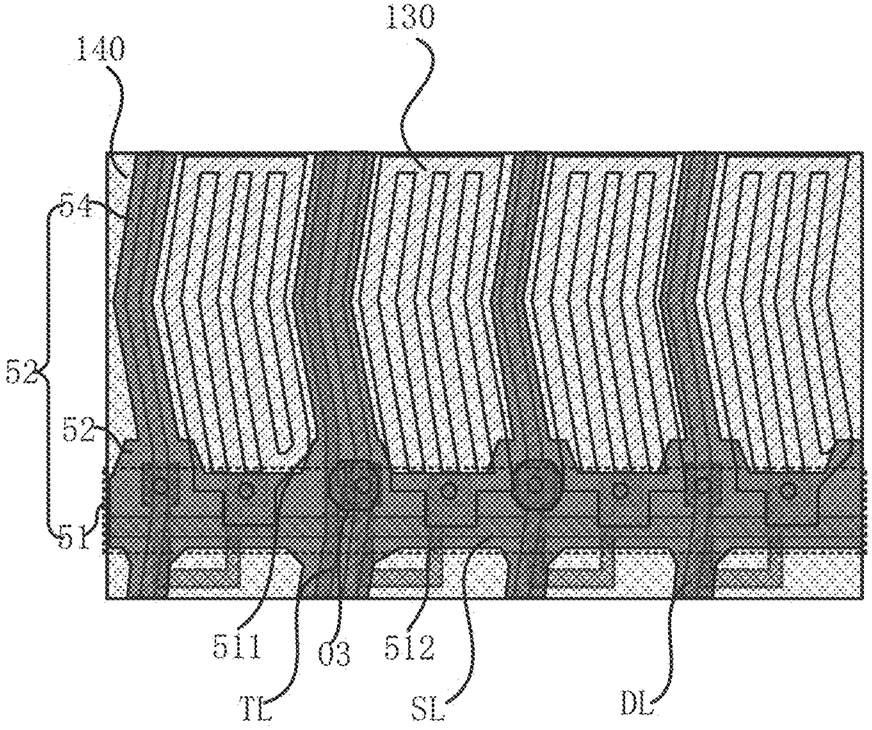
FIG. 35 is another schematic partial view of a display panel according to some embodiments of the present disclosure.
Figure 36:
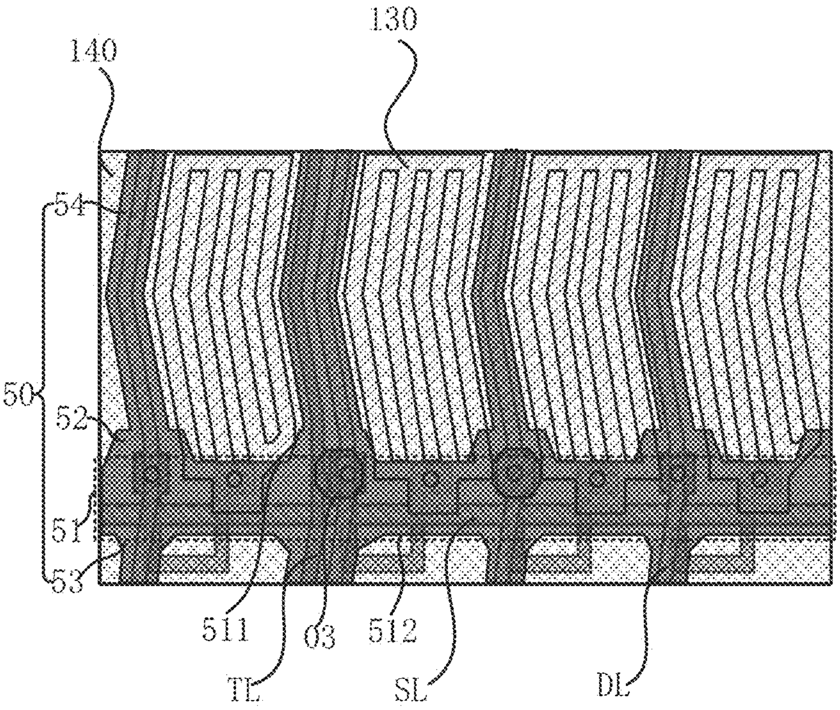
FIG. 36 is another schematic partial view of a display panel according to some embodiments of the present disclosure.

FIG. 35 is another schematic partial view of a display panel according to some embodiments of the present disclosure. FIG. 36 is another schematic partial view of a display panel according to some embodiments of the present disclosure.

In an embodiment of the present disclosure, referring to FIG. 35 and FIG. 36, the first base plate 01 includes a black matrix 05, and/or, the second base plate 02 includes a black matrix 05. In other words, the display panel includes the black matrix 05. The black matrix 05 may be provided on the first base plate 01, or may also be provided on the second base plate 02, or the black matrix 05 includes a portion provided on the first base plate 01 and another portion provided on the second base plate 02.

Along the direction Z perpendicular to the plane of the display panel, the black matrix 05 covers the scan line SL, the data line DL and the touch line TL. The black matrix 05 can make these signal lines invisible, so as not to affect the display effect of the display panel. In addition, the black matrix 05 can prevent mutual interference of light rays between adjacent sub-pixels.

Referring also to FIG. 35 and FIG. 36, the black matrix 05 includes a first main body portion 51. An extension direction of the first main body portion 51 is parallel to the extension direction of the scan line SL. As shown in FIG. 35 and FIG. 36, both the extension direction of the first main body portion 51 and the extension direction of the scan line SL are parallel to the first direction X.

The first main body portion 51 includes a first edge 511 and a second edge 512 opposite to each other. Both an extension direction of the first edge 511 and an extension direction of the second edge 512 are parallel to the scan line SL, and an arrangement direction for the first edge 511 and the second edge 512 is perpendicular to the extension direction of the scan line SL. As shown in FIG. 35 and FIG. 36, the first edge 511 and the second edge 512 of the first main body portion 51 are respectively an upper edge and a lower edge of the first main body portion 51.

In some embodiments, the black matrix 05 includes multiple first protrusion portions 52. The first protrusion portions 52 are arranged at a side of the first edge 511 away from the second edge 512, and the first protrusion portions 52 are connected to the first edge 511. Along the direction Z perpendicular to the plane of the display panel, the first protrusion portions 52 each at least partially overlap with the support pillar 03. It is to be understood that the first edge 511 of the first main body portion 51 is closer to the support pillar 03 than the second edge 512, and the side of the first edge 511 away from the second edge 512 is provided with the first protrusion portion 52 overlapping with the support pillar 03.

The support pillar 03 can be covered by the black matrix 05, which makes the support pillar 03 invisible to human eyes, so as not to affect the display effect of the display panel.

In some embodiments, the black matrix 05 may include multiple second protrusion portions 53. The second protrusion portions 53 are arranged at a side of the second edge 512 away from the first edge 511, and the second protrusion portions 53 are connected to the second edge 512. Along the direction Z perpendicular to the plane of the display panel, the second protrusion portions 53 each do not overlap with the support pillar 03. It is to be understood that the second edge 512 of the first main body portion 51 is further away from the support pillar 03 than the first edge 511.

In the embodiment of the present disclosure, as shown in FIG. 35 and FIG. 36, along a direction perpendicular to the extension direction of the scan line SL, the first protrusion portion 52 is wider than the second protrusion portion 53. In other words, the first protrusion portion 52 overlapping with the support pillar 03 has a larger protruding width toward a region where the support pillar 03 is located, and the second protrusion portion 53 not overlapping with the support pillar 03 has a smaller protruding width away from the region where the support pillar 03 is located. With the larger protruding width of the first protrusion portion 52, the support pillar 03 can be effectively shielded. With the smaller protruding width of the second protrusion portion 53, the opening area of the sub-pixel in the display panel can be effectively ensured.

The black matrix 05 includes a parallel portion 54 with an extension direction parallel to the extension direction of the data line DL and the extension direction of the touch line TL. The first protrusion portion 52 and the second protrusion portion 53 differ from the parallel portion 54 in: A width of the first protrusion portion 52 along the first direction X and a width of the second protrusion portion 53 along the first direction X are greater than a width of the parallel portion 54 along the first direction X.

In an implementation, as shown in FIG. 35, along the direction perpendicular to the extension direction of the scan line SL, the second protrusion portion 53 has a width of 0, namely the side of the second edge 512 away from the first edge 511 is not provided with the protrusion portion.

In an implementation, as shown in FIG. 36, along the direction perpendicular to the extension direction of the scan line SL, the second protrusion portion 53 has a width greater than 0, namely the side of the second edge 512 away from the first edge 511 is provided with the protrusion portion.

Figure 37:
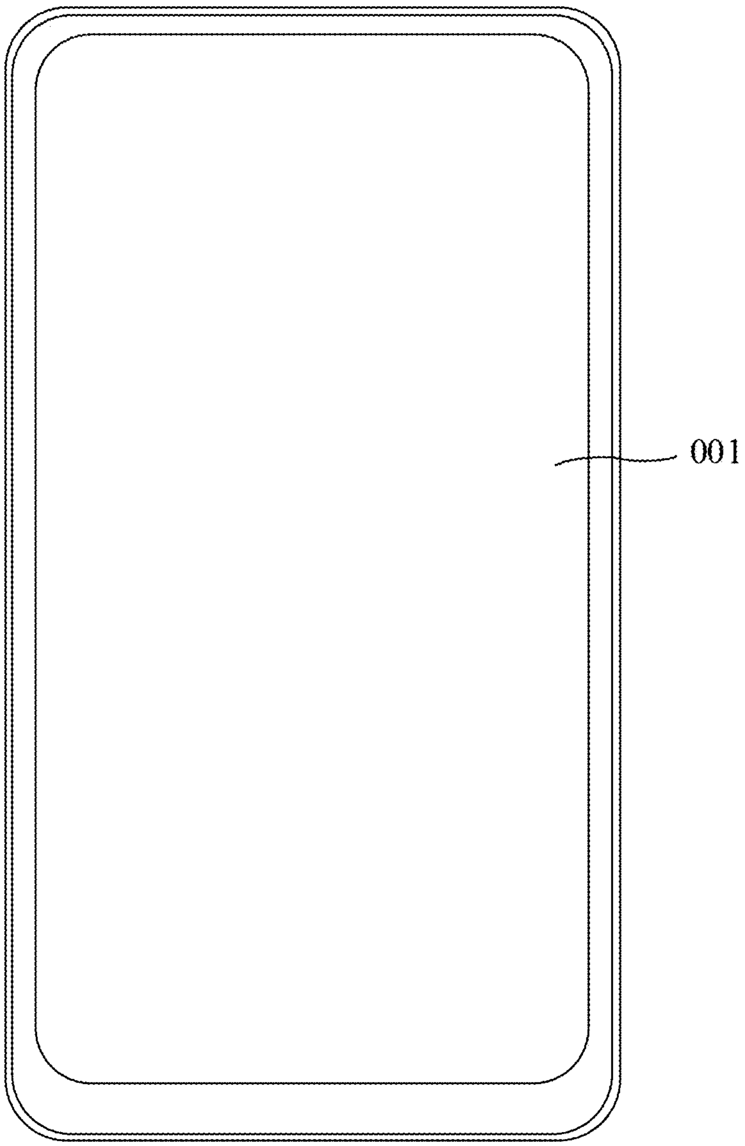
FIG. 37 is a schematic view of a display apparatus according to some embodiments of the present disclosure.

FIG. 37 is a schematic view of a display apparatus according to some embodiments of the present disclosure.

In an embodiment of the present disclosure, as shown in FIG. 37, a display apparatus provided by the present disclosure includes the display panel 001 according to any one of the foregoing embodiments. For example, the display apparatus may be an electronic device such as a mobile phone, a computer, an intelligent wearable device (for example, a smart watch), and an in-vehicle display apparatus. This is not limited in the embodiments of the present disclosure.

The display apparatus using the concept of the present disclosure has a small thickness, a simple process, and a low preparation cost.

The above descriptions are merely exemplary embodiments of the present disclosure and are not intended to limit the present disclosure. Any modification, equivalent replacement and improvement within the principle of the present disclosure shall be included within the scope of the present disclosure.

What is claimed is:

1. A display panel, comprising:

a first base plate, wherein the first base plate comprises:

a first substrate;

a transistor array layer provided at a side of the first substrate and comprising a transistor;

a pixel electrode layer and a common electrode layer that are provided at a side of the transistor array layer away from the first substrate, the pixel electrode layer comprising a pixel electrode, and the common electrode layer comprising at least one common electrode;

a first inorganic insulating layer that is an insulating layer between the transistor array layer and one of the pixel electrode layer and the common electrode layer close to the transistor array layer; and a second inorganic insulating layer provided between the pixel electrode layer and the common electrode layer, wherein the first inorganic insulating layer has a thickness less than or equal to 6,000 angstroms, or the second inorganic insulating layer has a thickness less than or equal to 6,000 angstroms.

2. The display panel according to claim 1, wherein the first inorganic insulating layer comprises at least one of silicon oxide or silicon nitride; or the second inorganic insulating layer comprises at least one of silicon oxide or silicon nitride; or wherein the transistor comprises a polysilicon semiconductor layer.

3. The display panel according to claim 1, wherein the first base plate further comprises at least one touch line provided on a side of the first inorganic insulating layer close to the first substrate and configured to provide a signal to the at least one common electrode, wherein a first slit is formed in one of the at least one common electrode, and at least a part of one first slit of the at least one first slit partially overlaps with one touch line of the at least one touch line along a direction perpendicular to a plane of the display panel, or, the at least one common electrode comprises a plurality of common electrodes, a second slit is formed between adjacent ones of the plurality of common electrodes, and at least a part of the second slit at least partially overlaps with one of the at least one touch line along the direction perpendicular to the plane of the display panel.

4. The display panel according to claim 3, wherein the first base plate further comprises at least one dummy touch line provided in a same layer as the at least one touch line and electrically insulated from the at least one common electrode, wherein, in a case where the first slit is formed in the one of the at least one common electrode, at least a part of the first slit at least partially overlaps with one of the at least one dummy touch line along the direction perpendicular to the plane of the display panel, or, in a case where the second slit is formed between the adjacent ones of the plurality of common electrodes, at least a part of the second slit at least partially overlaps with one of the at least one dummy touch line along the direction perpendicular to the plane of the display panel.

5. The display panel according to claim 1, wherein the first base plate further comprises a data line provided on a side of the first inorganic insulating layer close to the first substrate and configured to provide a signal for the pixel electrode, wherein a first slit is formed in one of the at least one common electrode, and the data line does not overlap with the first slit along a direction perpendicular to a plane of the display panel, or, the at least one common electrode comprises a plurality of common electrodes, a second slit is formed between adjacent ones of the plurality of common electrodes, and the data line does not overlap with the second slit along the direction perpendicular to the plane of the display panel.

6. The display panel according to claim 1, wherein the first base plate further comprises a touch line provided on a side of the common electrode layer close to the first substrate;

a plurality of first vias are formed in the first inorganic insulating layer, and a plurality of second vias are formed in the second inorganic insulating layer; and the common electrode layer is provided on a side of the pixel electrode layer close to the transistor array layer, and the pixel electrode layer further comprises a bridge electrode electrically connected to one of the at least one common electrode through the second vias, wherein the bridge electrode is electrically connected to the touch line through the second via and the first via that communicate with each other.

7. The display panel according to claim 6, wherein at least one first opening is formed in the at least one common electrode, wherein one of the at least one first opening overlaps with one of the plurality of first vias along a direction perpendicular to a plane of the display panel.

8. The display panel according to claim 7, wherein at least one first opening comprises a plurality of first openings, wherein at least two first openings of the plurality of first openings have different opening areas.

9. The display panel according to claim 1, wherein the transistor comprises a first electrode electrically connected to a data line, and a second electrode electrically connected to the pixel electrode, wherein at least one second opening is formed in the at least one common electrode, and one of the at least one second opening at least partially overlaps with the first electrode of the transistor along a direction perpendicular to a plane of the display panel, or, at least one third opening is formed in the at least one common electrode, and one of the at least one third opening at least partially overlaps with the second electrode of the transistor along the direction perpendicular to the plane of the display panel.

10. The display panel according to claim 9, wherein in a case where the at least one second opening comprises a plurality of second openings and the at least one common electrode comprises a plurality of common electrodes and the plurality of second openings are formed in the plurality of common electrodes, respectively, at least two second openings of the plurality of second openings have different opening areas; or, in a case where the at least one third opening comprises a plurality of third openings and the at least one common electrode comprises a plurality of common electrodes and the plurality of third openings are formed in the plurality of common electrodes, respectively, at least two third openings of the plurality of third openings have different opening areas.

11. The display panel according to claim 1, further comprising:

a second base plate comprising a second substrate; and at least one support pillar provided between the first substrate and the second substrate, wherein the first base plate further comprises scan lines and data lines, wherein an extension direction of each of the scan lines intersects an extension direction of each of the data lines, and one of the at least one support pillar does not overlap with at least one of one of the scan lines and one of the data lines along a direction perpendicular to a plane of the display panel.

12. The display panel according to claim 11, wherein along the direction perpendicular to the plane of the display panel, one of the at least one support pillar overlaps with at least one of the data lines and does not overlap with the scan lines.

13. The display panel according to claim 12, wherein one of the data lines comprises a first portion and a second portion, wherein at least a part of one support pillar of the at least one support pillar overlaps with the first portion along the direction perpendicular to the plane of the display panel, and the first portion has a width along a first direction greater than a width of the second portion along the first direction, the first direction being perpendicular to the extension direction of each of the data lines.

14. The display panel according to claim 13, wherein the first portion of one of the data lines has a cross-shaped peripheral contour; or, wherein the transistor comprises a first electrode electrically connected to one of the data lines, and a second electrode electrically connected to the pixel electrode, wherein the first portion overlaps with the first electrode of the transistor along the direction perpendicular to the plane of the display panel.

15. The display panel according to claim 12, wherein the first base plate further comprises a touch line, wherein an extension direction of the touch line is the same as the extension direction of each of the data lines; and along the direction perpendicular to the plane of the display panel, one of the at least one support pillar overlaps with at least a part of the touch line;

the touch line comprises a third portion and a fourth portion; and along the direction perpendicular to the plane of the display panel, at least a part of one of the at least one support pillar overlaps with the third portion; and the third portion has a width along a first direction greater than a width of the fourth portion along the first direction, the first direction being perpendicular to the extension direction of the touch line.

16. The display panel according to claim 12, wherein a minimum distance between an orthographic projection of one of the at least one support pillar on the first substrate and an orthographic projection of one of the scan lines on the first substrate is greater than or equal to 2 μm.

17. The display panel according to claim 12, wherein at least one of the first base plate or the second base plate further comprises a black matrix, wherein the black matrix comprises:

a first main body portion, wherein an extension direction of the first main body portion is parallel to the extension direction of each of the scan lines; along the direction perpendicular to the plane of the display panel, the first main body portion covers one of the scan lines; the first main body portion comprises a first edge and a second edge opposite to each other; and both an extension direction of the first edge and an extension direction of the second edge are parallel to each of the scan lines, and the first edge and the second edge are arranged in a direction perpendicular to the extension direction of each of the scan lines;

a plurality of first protrusion portions arranged at a side of the first edge away from the second edge, and connected to the first edge; and a plurality of second protrusion portions arranged at a side of the second edge away from the first edge, and connected to the second edge;

wherein along the direction perpendicular to the plane of the display panel, one of the plurality of first protrusion portions at least partially overlaps with one of the at least one support pillar, and each of the plurality of second protrusion portions overlaps with none of the at least one support pillar; and along a direction perpendicular to the extension direction of each of the scan lines, a width of one of the plurality of first protrusion portions is greater than a width of the plurality of second protrusion portions.

18. The display panel according to claim 1, wherein the first base plate further comprises a data line and a touch line, wherein the data line is electrically connected to the pixel electrode, and the touch line is electrically connected to one of the at least one common electrode and is located in a same layer as the data line.

19. A display apparatus, comprising a display panel, wherein the display panel comprises:

a first base plate, wherein the first base plate comprises:

a first substrate;

a transistor array layer provided on a side of the first substrate and comprising a transistor;

a pixel electrode layer and a common electrode layer that are provided on a side of the transistor array layer away from the first substrate, the pixel electrode layer comprising a pixel electrode, and the common electrode layer comprising at least one common electrode;

a first inorganic insulating layer that is an insulating layer between the transistor array layer and one of the pixel electrode layer and the common electrode layer close to the transistor array layer; and a second inorganic insulating layer provided between the pixel electrode layer and the common electrode layer, wherein the first inorganic insulating layer has a thickness less than or equal to 6,000 angstroms, or the second inorganic insulating layer has a thickness less than or equal to 6,000 angstroms.

* * * * *